US012640737B2

(12) United States Patent
Gupta et al.

(10) Patent No.: US 12,640,737 B2
(45) Date of Patent: May 26, 2026

(54) FAILSAFE INPUT-OUTPUT CIRCUIT

(71) Applicant: TEXAS INSTRUMENTS INCORPORATED, Dallas, TX (US)

(72) Inventors: Siddharth Gupta, Gurugram (IN); Sneha Shetty, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 18/817,852

(22) Filed: Aug. 28, 2024

(65) Prior Publication Data

US 2026/0066902 A1 Mar. 5, 2026

(51) Int. Cl.
*H03K 19/007* (2006.01)
*H03K 17/687* (2006.01)
*H03K 19/003* (2006.01)

(52) U.S. Cl.
CPC ......... *H03K 19/007* (2013.01); *H03K 17/687* (2013.01); *H03K 19/00315* (2013.01); *H03K 2217/0063* (2013.01); *H03K 2217/0072* (2013.01); *H03K 2217/0081* (2013.01)

(58) Field of Classification Search
CPC ............... H03K 19/007; H03K 17/687; H03K 19/00315; H03K 2217/0063; H03K 2217/0072; H03K 2217/0081
See application file for complete search history.

(56) References Cited

U.S. PATENT DOCUMENTS 5,543,733 A * 8/1996 Mattos ............. H03K 19/00315
326/68
5,646,550 A * 7/1997 Campbell, Jr. .. H03K 19/09429
326/58

* cited by examiner

*Primary Examiner* — Daniel D Chang
(74) *Attorney, Agent, or Firm* — Michelle F. Murray; Frank D. Cimino

(57) ABSTRACT

A circuit includes an input-output, a supply terminal, a reference terminal, a high-side transistor, a low-side transistor, a driver, and a bias generation circuit. The driver circuit includes a first inverter having an output, a second inverter having an input, an output, and first and second supply inputs, and a transmission gate having an input, an output, and first and second enable inputs. The input of the second inverter is coupled to the output of the first inverter. The first enable input is coupled to the output of the first inverter, the second enable input is coupled to the output of the second inverter, the output of the transmission gate is coupled to the output of the driver, the first supply input of the second inverter is coupled to the output of the transmission gate, and the second supply input of the second inverter is coupled to a reference terminal.

20 Claims, 15 Drawing Sheets

100

FAILSAFE INPUT-OUTPUT CIRCUIT

TECHNICAL FIELD

The present disclosure relates generally to an electronic systems and methods, and, in particular embodiments, to a failsafe input-output (IO) circuit.

BACKGROUND

In embedded systems, such as integrated circuits (ICs), input-output (IO) devices/circuits/cells are often included to interface elements of the ICs with external peripheral devices to communicate information between a system and the external peripheral devices. For example, when enabled, an IO device may transfer or receive data to/from other elements of a system such as a peripheral device. When disabled, the IO device may be gated to prevent such communications.

SUMMARY

In accordance to an embodiment, an electronic circuit includes: an input-output (IO) terminal; a supply terminal; a reference terminal; a high-side transistor having a current path coupled between the supply terminal and the IO terminal; a low-side transistor having a current path coupled between the IO terminal and the reference terminal; a driver having an input and an output, the output of the driver coupled to a control terminal of the high-side transistor; and a bias generation circuit having an output coupled to a bulk terminal of the high-side transistor; where the driver includes: a first inverter having an output; a second inverter having an input, an output, and first and second supply inputs, where the input of the second inverter is coupled to the output of the first inverter; and a transmission gate having an input, an output, and first and second enable inputs, where the first enable input of the transmission gate is coupled to the output of the first inverter, where the second enable input of the transmission gate is coupled to the output of the second inverter, where the output of the transmission gate is coupled to the output of the driver, where the first supply input of the second inverter is coupled to the output of the transmission gate, and where the second supply input of the second inverter is coupled to the reference terminal.

In accordance to an embodiment, an electronic circuit includes: an input-output (IO) terminal; a supply terminal; a reference terminal; a high-side transistor having a current path coupled between the supply terminal and the IO terminal; a low-side transistor having a current path coupled between the IO terminal and the reference terminal; a driver having an input and an output, the output of the driver coupled to a control terminal of the high-side transistor; and a bias generation circuit having an output coupled to a bulk terminal of the high-side transistor; where the bias generation circuit includes: a latch having an input and an output; a first transistor having a control terminal coupled to the supply terminal, and a current path coupled between the IO terminal and the first node of the latch; a second transistor having a control terminal coupled to the second node of the latch, and a current path coupled between the IO terminal and the output of the bias generation circuit; and a third transistor having a control terminal coupled to the input of the latch, and a current path coupled between the power supply terminal and the output of the bias generation circuit.

In accordance to an embodiment, a system includes: an input-output (IO) terminal; a supply terminal; a reference terminal; a high-side transistor having a current path coupled between the supply terminal and the IO terminal; a low-side transistor having a current path coupled between the IO terminal and the reference terminal; a driver having an input and an output, the input coupled to receive a data signal and an enable signal, the output of the driver coupled to the high-side transistor; and a bias generation circuit having an output coupled to the high-side transistor; where the bias generation circuit is configured to: determine an IO signal having a first value at the IO terminal; generate a bias signal having a second value based on the first value of the IO signal at the IO terminal; and provide the bias signal to the driver; and where the driver is configured to: based on a first state of the enable signal, drive the input signal to the IO terminal via the high-side transistor; and based on a second state of the enable signal, gate the input signal from being provided from the driver to the IO terminal and gate the IO signal from being provided from the IO terminal to the supply terminal based on providing a control signal to the high-side transistor, the control signal having a third value based on the second value of the bias signal.

BRIEF DESCRIPTION OF THE DRAWINGS

For a more complete understanding of the present invention(s), and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION

Figure 1:
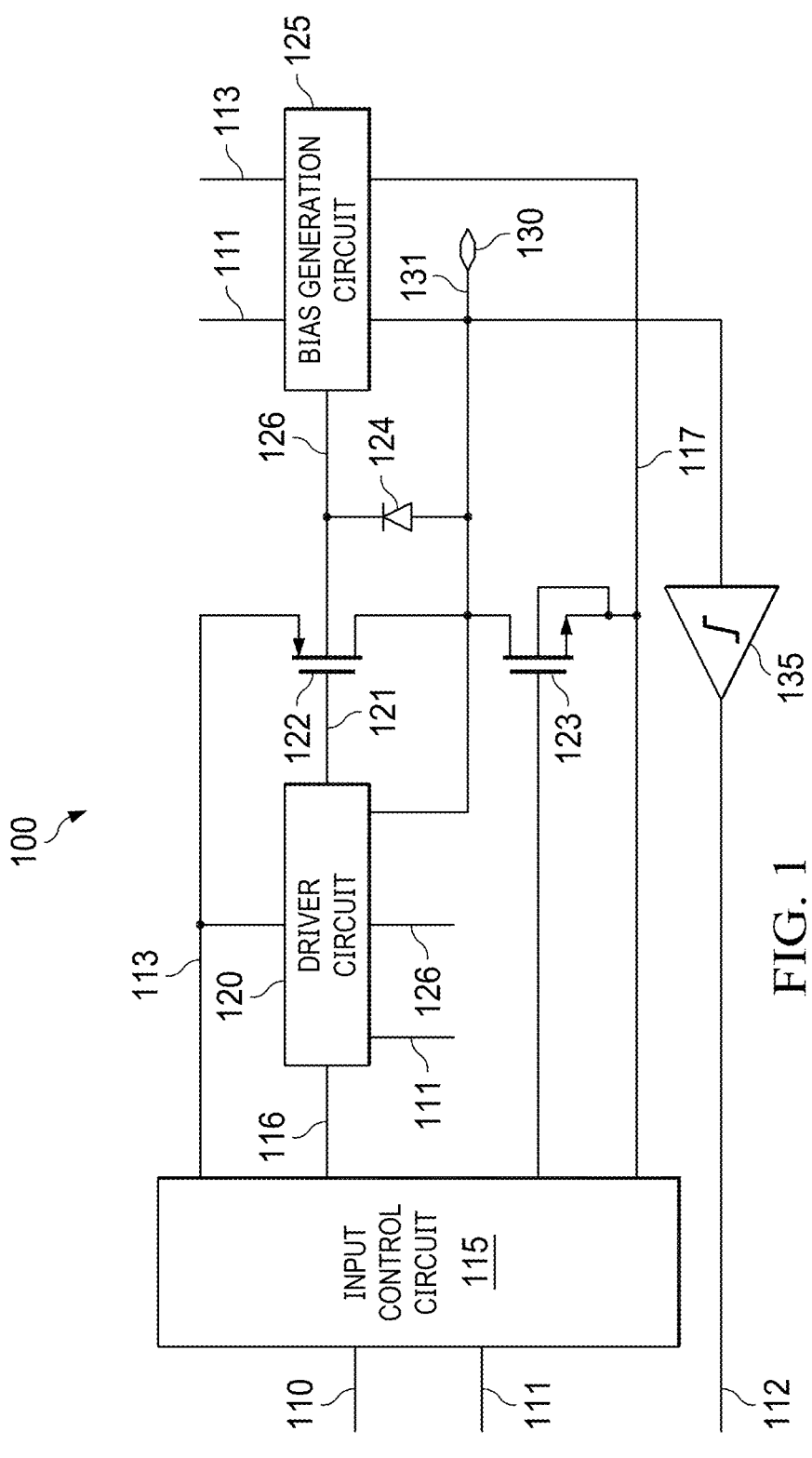
FIG. 1 illustrates an example input-output (IO) circuit that may be used in accordance with an embodiment.

The making and using of the embodiments disclosed are discussed in detail below. It should be appreciated, however, that the present disclosure provides many applicable inventive concepts that can be embodied in a wide variety of specific contexts. The specific embodiments discussed are merely illustrative of specific ways to make and use the invention(s), and do not limit the scope of the invention(s).

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Often, IO devices are required to include failsafe and over-voltage tolerance functionality to prevent leakage and damage to the elements of the system when the IO devices are disabled. For example, when an IO device is disabled but peripheral devices are enabled and injecting current into the IO device, the IO device may prevent the current from flowing to elements of the system.

Existing solutions include cascoded transistor circuits and/or large resistors to reduce or eliminate such current flow from the peripheral devices. However, such solutions may require large amounts of area to include these elements, which may increase the cost of the design of such systems.

Existing solutions might not eliminate all back-current flowing from the peripheral devices, and may introduce additional current by a product of turning on and off based on the amount of current output by the peripheral devices. As such, the efficiency of IO devices with respect to power consumption may remain problematic, especially in low-power embedded systems.

Some embodiments discussed herein include enhanced components, techniques, and systems related to input-output (IO) driver circuits, and more particularly, to controlling one or more transistors of a system to regulate voltages of the system while reducing leakage currents and current consumption by elements of the system. IO driver circuits are often included in systems, e.g., systems-on-chip (SoCs), to provide data signals to coupled devices (e.g., peripheral devices) when enabled. For example, an IO driver circuit may be included to provide data from a processor (e.g., a central processing unit (CPU)) to one or more peripherals (e.g., an analog-to-digital converter (ADC)), or from one or more peripherals to the processor or to one or more other peripherals.

IO circuit designs generally include elements to gate data signals from being provided to coupled devices, provide data signals to coupled devices, and to prevent such coupled devices from injecting current into the power supply of the IO circuit when the power supply and the IO circuit are not enabled. For example, an IO circuit may include a transmission gate circuit operable in different modes. In one mode, the transmission gate circuit generates signals at an output of the IO circuit based on input data signals. In another mode, the transmission gate prevents signals from being output by the IO circuit.

If the transmission gate circuit is not disabled in some situations, unwanted current may flow from the output of the IO circuit to a power supply of the IO circuit. For example, if the transmission gate circuit is enabled when it is not desirable to output signals at the output of the IO circuit, other circuits may inject current into the IO circuit and unwanted current may flow from the output of the IO circuit to a power supply of the IO circuit. By way of another example, an IO circuit may include cascode (e.g., two-stage) transistors to control current flow between the power supply of the circuit and coupled devices to the circuit. However, cascoded driver solutions may require additional components, which may increase the design area and cost.

Some embodiments relate to an integrated circuit that includes an IO buffer capable of providing signals to downstream peripherals via an IO terminal or gating signals to and from the IO terminal, including leakage currents from the peripherals to elements of the IO buffer. When enabled to operate in a gating mode, a driver (e.g., a non-cascoded driver circuit) and a bias generation circuit control an output transistor of the IO buffer based on a control voltage that includes a maximum of a supply voltage of the IO buffer and the voltage present at the IO terminal. The output transistor prevents back-current from the IO terminal to reach the power supply of the IO buffer, which may advantageously prevent damage to the power supply. Additionally, elements of the driver and the bias generation circuit may include redundant components to precisely control the control voltage based on the voltage at the IO terminal relative to the supply voltage.

Advantageously, in some embodiments, an integrated circuit can function in multiple modes without introducing static current and while reducing dynamic current throughout the integrated circuit. In a driving mode, the integrated circuit outputs signals and power to an output. In a gating mode, the integrated circuit gates signals from being provided to the output and also prevents current from flowing from an external source (coupled at the output) to a power supply of the integrated circuit. In some embodiments, not only may the integrated circuit provide a failsafe IO circuit for use in various applications, but also the integrated circuit may advantageously reduce current consumption and current production at an output of the IO circuit (e.g., an output pad) in tolerant operating modes (e.g., when the voltage at the output of the integrated circuit is greater than the voltage of the power supply).

In an example embodiment, an electronic circuit is provided that includes an input-output (IO) terminal, a supply terminal, a reference terminal, a high-side transistor having a current path coupled between the supply terminal and the IO terminal, a low-side transistor having a current path coupled between the IO terminal and the reference terminal, a driver having an input and an output, the output of the driver coupled to a control terminal of the high-side transistor, and a bias generation circuit having an output coupled to a bulk terminal of the high-side transistor. The driver circuit includes a first inverter having an output, a second inverter having an input, an output, and first and second supply inputs, and a transmission gate having an input, an output, and first and second enable inputs. The input of the second inverter is coupled to the output of the first inverter. The first enable input of the transmission gate is coupled to the output of the first inverter, the second enable input of the transmission gate is coupled to the output of the second inverter, the output of the transmission gate is coupled to the output of the driver, the first supply input of the second inverter is coupled to the output of the transmission gate, and the second supply input of the second inverter is coupled to the reference terminal.

In another example embodiment, an electronic circuit is provided that includes an input-output (IO), a supply terminal, a reference terminal, a high-side transistor having a current path coupled between the supply terminal and the IO terminal, a low-side transistor having a current path coupled between the IO terminal and the reference terminal, a driver having an input and an output, the output of the driver coupled to a control terminal of the high-side transistor, and a bias generation circuit having an output coupled to a bulk terminal of the high-side transistor. The bias generation circuit also includes a latch having a first node and a second node, a first transistor having a control terminal coupled to the supply terminal, and a current path coupled between the IO terminal and the first node of the latch, a second transistor having a control terminal coupled to the second node of the latch, and a current path coupled between the IO terminal and the output of the bias generation circuit, and a third transistor having a control terminal coupled to the first node of the latch, and a current path coupled between the power supply terminal and the output of the bias generation circuit.

In yet another example embodiment, a system including an IO terminal, a supply terminal, a reference terminal, a high-side transistor having a current path coupled between the supply terminal and the IO terminal, a low-side transistor having a current path coupled between the IO terminal and the reference terminal, a driver having an input and an output, the input coupled to receive a data signal and an enable signal, the output of the driver coupled to the high-side transistor, and a bias generation circuit having an output coupled to the high-side transistor is provided. The bias generation circuit is configured to determine an IO signal having a first value at the IO terminal, generate a bias signal having a second value based on the first value of the IO signal at the IO terminal, and provide the bias signal to the driver. The driver is configured to, based on a first state of the enable signal, drive the input signal to the IO terminal via the high-side transistor, and based on a second state of the enable signal, gate the input signal from being provided from the driver to the IO terminal and gate the IO signal from being provided from the IO terminal to the supply terminal based on providing a control signal to the high-side transistor, the control signal having a third value based on the second value of the bias signal.

FIG. 1 illustrates an example input-output (IO) circuit that may be used in accordance with an embodiment. FIG. 1 shows system 100, which includes input control circuit 115, driver circuit 120, bias generation circuit 125, and amplifier 135. System 100 also includes transistor 122, transistor 123, diode 124, and input-output (IO) terminal 130.

In some embodiments, system 100 may be used (e.g., by an IC) to implement a dedicated IO or a general purpose IO (GPIO). In some embodiments, an IC may include multiple instances of system 100.

In various embodiments, system 100 is representative of an IO circuit configured to output signal 131 at IO terminal 130 based on input signal 110, and gate signal 131 from being output at IO terminal 130 based on a mode of system 100 determined by enable signal 111. In some embodiments, the IO circuit may also receive a signal via IO terminal 130, e.g., to be processed by a receive path including amplifier 135.

In some embodiments, when enabled to operate in a first mode (driving mode) based on a first value of enable signal 111, system 100 is configured to receive input signal 110 and provide signal 131 to IO terminal 130 based on input signal 110. When enabled to operate in a second mode (gating mode) based on a second value of enable signal 111, system 100 is configured to gate signal 131 from being provided to IO terminal 130 and gate current from flowing from IO terminal 130 to supply terminal 113, among other components of system 100.

In some embodiment, elements of system 100, such as driver circuit 120, transistors 122 and 123, and bias generation circuit 125 are representative of a transmitting path of an IO buffer. In some such embodiments, the IO buffer may also include a receiving path that includes amplifier 135 (e.g., a buffer). In some embodiments, the IO buffer is configured to transmit signals from IO terminal 130 when enabled, and to receive signals at IO terminal 130 via amplifier 135 (e.g., when in gating mode).

In some embodiments, input control circuit 115 receives a supply power from supply terminal 113 and receives input signal 110 and enable signal 111 from a system or device (e.g., a processor, a peripheral device) coupled to input control circuit 115. In some embodiments, input control circuit 115 is representative of a stage of an IO circuit capable of receiving input signals (e.g., input signal 110), selecting input signal 116 among the input signals, and providing input signal 116 to driver circuit 120 for further distribution thereof. In some embodiments, input control circuit 115 includes one or more level shifters. In some embodiments, input control circuit 115, one or more logic devices (e.g., OR gates, XOR gates, AND gates, NAND gates), and the like.

In some embodiments, driver circuit 120 is representative of a driver (e.g., a control driver, a gate driver (e.g., a PMOS gate driver)) capable of receiving input signal 116 from input control circuit 115, receiving the supply power from supply terminal 113, receiving enable signal 111 from input control circuit 115, and performing either driving or gating operations based on enable signal 111. In some embodiments, in a driving mode, driver circuit 120 generates signal 121 based on input signal 116 to cause generation of signal 131 at IO terminal 130 based on input signal 116, and, in a gating mode, driver circuit 120 causes transistor 122 to be off independent of the state of input signal 116 to gate generation of signal 131 based on input signal 116. For example, in some embodiments, in the gating mode, the output stage of system 100 (e.g., including transistors 122 and 123) may be disabled, e.g., causing the output stage of system 100 to be in high-impedance mode.

In some embodiments, driver circuit 120 is enabled to operate in one of the modes based on enable signal 111. In some embodiments, driver circuit 120 includes various inverters and transistors arranged in a topology to perform such activities. In some embodiments, driver circuit 120 includes a topology illustrated in and described by FIG. 2 below. In some embodiments, driver circuit 120 includes a topology illustrated in and described by FIG. 11 below.

To perform such driving and gating operations, in some embodiments, driver circuit 120 is coupled to transistor 122 and controls operations (e.g., states, e.g., open or closed) of transistor 122 based on enable signal 111. Transistor 122 may be a high-side output transistor configured to operate as a switch. In one state (e.g., corresponding to the driving mode), driver circuit 120 generates signal 131 at IO terminal 130 based on input signal 116 using transistor 122, and in another state (e.g., corresponding to the gating mode), driver circuit 120 gates signals from being provided to IO terminal 130 using transistor 122.

In some embodiments, transistor 122 is a p-type transistor, such as a p-type metal-oxide semiconductor field effect transistor (MOSFET) or PMOS. In some such embodiments, transistor 122 includes a control terminal, first and second current path terminals, and a body, or bulk, terminal. The control terminal of transistor 122 may be coupled to driver circuit 120 to receive control voltage 121, the body terminal of transistor 122 may be coupled to diode 124 and to bias generation circuit 125, the first current path terminal may be coupled to supply terminal 113, the second current path terminal may be coupled to transistor 123, to diode 124, to bias generation circuit 125, and to IO terminal 130. In some embodiments, diode 124 is representative of a parasitic n-well diode capable of restricting current flow in a direction through system 100.

Transistor 123 may be a low-side transistor included in system 100. In some embodiments, transistor 123 is an n-type transistor, such as an n-type MOSFET, or NMOS. Transistor 123 may be coupled to input control circuit 115 at a control terminal of transistor 123 and to reference terminal 117 at a current path terminal and a body terminal of transistor 123. In some embodiments, transistor 123 may be configured to operate as a switch like transistor 122. Particularly, in one state (e.g., corresponding to the driving mode), driver circuit 120 generates the signal at IO terminal 130 based on a signal used to drive transistor 123 (e.g., a complementary signal relative to input signal 116), and in another state (e.g., corresponding to the gating mode), driver circuit 120 gates signals from being provided to IO terminal 130 using transistor 123 (as well as transistor 122). As such, transistors 122 and 123 may function as an output stage of system 100 capable of controlling outputs at IO terminal 130.

In some embodiments, in a (e.g., first) driving mode, the output stage of system 100 operates in a push-pull configuration, in which, signal 131 is high when signal 116 is high (e.g., by turning on transistor 122 and turning off transistor 123, and signal 131 is low when signal 116 is low (e.g., by turning off transistor 122 and turning on transistor 123). In some embodiments, in a (e.g., second) driving mode, the output stage of system 100 operates in an open drain configuration, in which transistor 122 is off (e.g., in gating mode), and signal 131 is lower when signal 116 is low (e.g., by turning on transistor 123), and signal 131 is high when signal 116 is high (e.g., by turning off transistor 123 and letting an external pull-up mechanism (e.g., external to system 100, such as external to the IC that includes system 100) to pull up IO terminal 130 to a high state.

In some embodiments, system 100 may be operated, in addition to the (e.g., first and/or second) driving mode, system 100 may be operated in a receive mode (e.g., where both transistors 122 and 123 are off (e.g., in gating mode) and signals received via IO terminal 130 are processed by amplifier 135 and provided to a processor (not shown), such as the same processor providing signals 110 and 111.

In some embodiments, system 100 may be operated, in addition to the (e.g., first and/or second) driving mode, and/or the receive mode, system 100 may be operated in an off mode (e.g., where both transistors 122 and 123 are off (e.g., in gating mode) and signals received via IO terminal 130, if any, are ignored. In the off mode, amplifier 135 may be disabled.

In some embodiments, bias generation circuit 125 is representative of a circuit capable of generating bias signal 126 to control the state of transistor 122 and influence control voltage 121 produced by driver circuit 120 based on the supply power from supply terminal 113, enable signal 111, and the voltage at IO terminal 130. In some such embodiments, bias generation circuit 125 includes various transistors, inverters and/or latches, and the like coupled in a topology to perform such activities. In some embodiments, bias generation circuit 125 includes a topology illustrated in and described by FIG. 3 below. In some embodiments, bias generation circuit 125 includes a topology illustrated in and described by FIGS. 12A and 12B below.

In some embodiments, IO terminal 130 is representative of a pad, terminal, terminal, port, or pin, or some combination or variation thereof, coupled to elements of system 100 and configured to be coupled to elements external to system 100, such as one or more peripheral devices. When driver circuit 120 is enabled (e.g., in the first driving mode), driver circuit 120 may cause signal 131 to be provided to IO terminal 130, e.g., and to coupled devices. When driver circuit 120 is in the gating mode (e.g., in the second driving mode, receive mode, or off mode) if devices coupled to IO terminal 130 are operating, external current may be provided to IO terminal 130 and may flow to and damage supply terminal 113 if not gated by transistor 122. Thus, driver circuit 120 and bias generation circuit 125 may be included to gate such currents via transistor 122 and diode 124 and prevent damage to supply terminal 113 among other components of system 100.

In some embodiments, amplifier 135 is included as part of a receiving path of system 100. Amplifier 135 may include multiple inputs coupled to IO terminal 130 and an output coupled to provide signal 112 to downstream systems, devices, and circuits. In some embodiments, amplifier 135 is implemented as a buffer or as an amplifier, such as a Schmitt trigger amplifier or buffer. Amplifier 135 may be implemented in ways known in the art.

In operation, driver circuit 120 is enabled when enable signal 111 includes a first value (e.g., 0). When enabled, driver circuit 120 receives input signal 116 and causes generation of signal 131 (e.g., via transistor 122) based on input signal 116. In such embodiments, IO terminal 130 may include a voltage equal to (or approximately equal to) or less than the voltage of supply terminal 113 and may drive the output signal to coupled devices.

In operation, driver circuit 120 is disabled (e.g., in gating mode) when enable signal 111 includes a second value opposite the first value (e.g., 1). When disabled, driver circuit 120 gates signals from flowing to IO terminal 130 (e.g., by keeping transistor 122 off), and driver circuit 120 and bias generation circuit 125 prevent current from flowing from IO terminal 130 to supply terminal 113. More specifically, driver circuit 120, or a transmission gate thereof, may be disabled via enable signal 111 such that transistor 122 and the gate of transistor 122 may be pulled-up such that transistor 122 is off irrespective of the value of signal 116.

In various embodiments, as explained in more detail below, e.g., with respect to FIG. 2, the transmission gate of driver circuit 120 operates based on enable signal 111 and control voltage 121. In this way, when enable signal 111 includes the second value, the transmission gate might not be enabled until the value of enable signal 111 switches to the first value. Advantageously, driver circuit 120 might not produce leakage current when disabled as the transmission gate may be turned off unless and until enable signal 111 includes the first value.

Based on the voltage at IO terminal 130 being less than or equal to the supply voltage of supply terminal 113, driver circuit 120 and bias generation circuit 125 produce control voltage 121 and bias signal 126, respectively, with voltages equal to the supply voltage to operate transistor 122 as a closed switch to prevent current from flowing from IO terminal 130 to supply terminal 113. Based on the voltage at IO terminal 130 being greater than the supply voltage, driver circuit 120 and bias generation circuit 125 produce control voltage 121 and bias signal 126, respectively, with voltages equal to the voltage at IO terminal 130 to operate transistor 122 as a closed switch. It follows that bias generation circuit 125 may be configured to generate bias signal 126 having a voltage that includes the maximum value between the voltage of IO terminal 130 and the voltage of the supply power of supply terminal 113. Further, it follows that driver circuit 120 may be configured to generate control voltage 121 having a voltage equal to bias signal 126, or the maximum between the voltages at IO terminal 130 and supply terminal 113, which may advantageously ensure that transistor 122 remains operating as a closed switch when enable signal 111 includes the second value as the control terminal of transistor 122 may include the highest potential between IO terminal 130 and supply terminal 113.

Specific topologies and operations of driver circuit 120 and bias generation circuit 125 will be described in more detail in the following figures.

Figure 2:
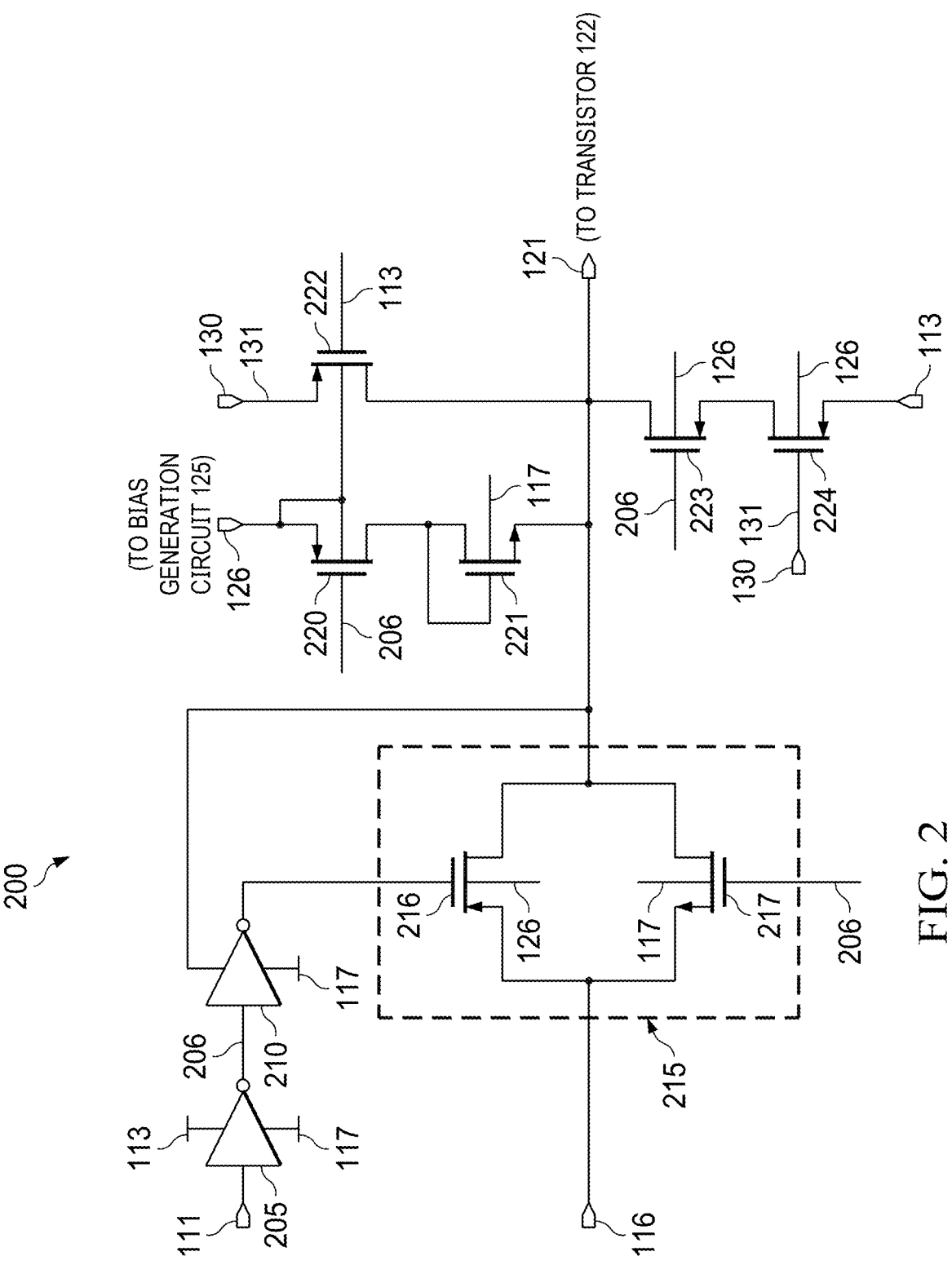
FIG. 2 illustrates an example driver circuit that may be used in accordance with an embodiment.

FIG. 2 illustrates an example driver circuit that may be used in accordance with an embodiment. FIG. 2 shows circuit 200, which includes inverter 205, inverter 210, transmission gate 215, transistors 220, 221, 222, 223, and 224, and various input and output terminals that may couple to other components of a system (e.g., system 100). In some embodiments, circuit 200 is representative of a driver circuit of an input-output cell, such as driver circuit 120 of FIG. 1.

In circuit 200, inverter 205 includes an input and an output. The input may be coupled to receive enable signal 111 from a system or circuit, such as input control circuit 115 of system 100. The output may be coupled to provide inverted enable signal 206 to an input of inverter 210. Inverter 205 may also include first and second supply inputs coupled to supply terminal 113 and to reference terminal 117, respectively. Inverter 210 also includes an input and an output. The input may be coupled to receive inverted enable signal 206, and the output may be coupled to transmission gate 215. Inverter 210 may also include first and second supply inputs coupled to an output of transmission gate 215 and to reference terminal 117, respectively. In this configuration, inverter 205 may be powered by supply terminal 113 while inverter 210 may be powered by control voltage 121. In this configuration, inverter 210 may output a voltage based on enable signal 111 and based on control voltage 121 to transistor 216, and inverter 205 may output a voltage based on enable signal 111 and supply 113 to transistor 217, such that inventers 205 and 206 enable or disable transmission gate 215.

In some embodiments, transmission gate 215 is representative of a circuit configured to drive or gate signals based on a mode of transmission gate 215. In particular, transmission gate 215 may receive input signal 116 from input control circuit 115 and provide signal 131 based on input signal 116 to the gate of transistor 122. Transmission gate 215 may gate signal 116 from being provided to the gate of transistor 122 when disabled (e.g., enable signal 111 includes a value of 1).

In some embodiments, transmission gate 215 includes two transistors, transistors 216 and 217, coupled together. Transmission gate 215 includes an input node (e.g., a node where first current path terminals of transistors 216 and 217 are coupled) coupled to receive input signal 116, and transmission gate 215 includes an output node (e.g., a node where second current path terminals of transistors 216 and 217 are coupled together) coupled to transistor 122, among other elements of circuit 200.

In some embodiments, transistor 216 is a PMOS transistor, and transistor 217 is an NMOS transistor that each include a control terminal, first and second current path terminals, and body, or bulk, terminals. The first current path terminals of transistors 216 and 217 may be coupled to each other and coupled to receive input signal 116 at the input node. The second current path terminals of transistors 216 and 217 may also be coupled to each other and may be coupled to transistor 122 at the output node. The control terminal of transistor 216, or the first enable input of transmission gate 215, may be coupled to the output of inverter 210, and the body terminal of transistor 216 may be coupled to receive bias signal 126. The control terminal of transistor 217, or the second enable input of transmission gate 215 may be coupled to the output of inverter 205 to receive inverted enable signal 206, and the body terminal of transistor 217 may be coupled to reference terminal 117.

In various embodiments, circuit 200 also includes transistors 220, 221, 222, 223, and 224, which may regulate the voltage of control voltage 121 output by circuit 200 to transistor 122 based on enable signal 111 including a value indicative of driver circuit 120 being disabled (e.g., 1). In some such embodiments, these transistors may be disabled (turned off) based on enable signal 111 including a value indicative of driver circuit 120 being enabled (e.g., 0). In some such embodiments, transistors 220, 222, 223, and 224 are PMOS transistors, while transistor 221 is an NMOS transistor. In some such embodiments, transistor 221 may be a native NMOS transistor with a low threshold voltage ($V_t$) (e.g., 0). Each transistor may include a control terminal, first and second current path terminals, and a body terminal coupled to one or more elements of circuit 200 and/or system 100.

In operation, when enable signal 111 includes a value corresponding to a driving mode of circuit 200 (or driver circuit 120) (e.g., 0), inverter 205 receives enable signal 111, inverts the value of enable signal 111 to produce inverted enable signal 206 having a value opposite of enable signal 111 (e.g., 1), and provides inverted enable signal 206 to inverter 210 and to transistor 217 of transmission gate 215. Inverter 210 can receive inverted enable signal 206, invert the value of inverted enable signal 206 to the value of enable signal 111 (e.g., 0), and provide the inverted value to transistor 216 of transmission gate 215. Based on the values of the signals provided to the control terminals of transistors 216 and 217 of transmission gate 215, transmission gate 215 may be enabled such that transistors 216 and 217 may provide signal 131 based on input signal 116 to the gate of transistor 122.

Further, while enable signal 111 includes the value corresponding to the driving mode, the voltage at IO terminal 130 may be driven by supply terminal 113. While operating in the driving mode, supply terminal 113 supplies IO terminal 130 with a supply voltage when the voltage at IO terminal 130 is driven high (e.g., IO terminal 130 is not driven externally by another power supply or integrated circuit), and thus, the voltage at IO terminal 130 includes a value less than or equal to the supply voltage provided by supply terminal 113. Based on the voltage at IO terminal 130 being less than or equal to the voltage of supply terminal 113, and based on the value of enable signal 111, transistors 220, 222, and 223 may be off (operating as open switches).

In operation, when enable signal 111 includes a value corresponding to a gating mode of circuit 200 (or driver circuit 120) (e.g., 1), inverter 205 receives enable signal 111, inverts the value of enable signal 111 to produce inverted enable signal 206 having a value opposite of enable signal 111 (e.g., 0), and provides inverted enable signal 206 to inverter 210 and to transistor 217 of transmission gate 215. Inverter 210 receives inverted enable signal 206, inverts the value of inverted enable signal 206 to the value of enable signal 111 (e.g., 1), and provides a signal to transistor 216 of transmission gate 215. Based on inverter 210 being powered by control voltage 121, the signal provided by inverter 210 to transistor 216 includes a voltage having the value of control signal 121, causing transistor 216 to turn off. Likewise, based on inverter 205 providing inverted enable signal 206 having a value of 0 to transistor 217, transistor 217 may also turn off. As a result, transmission gate 215 is disabled and does not provide signal 131 to transistor 122 unless and until enable signal 111 changes values. Advantageously, based on inverter 210 being powered by control voltage 121, when enable signal 111 includes a value of 1, inverter 210 may fully disable transmission gate 215. Such disabling of transmission gate 215 may prevent transmission gate 215 from producing leakage current when gating mode is enabled. Advantageously, the disabling of transmission gate 215 in this way may reduce dynamic current flow from IO terminal 130 to supply terminal 113 unlike existing solutions where transmission gates are not fully disabled unless and until a voltage at an IO terminal exceeds a supply power of the existing design.

In some embodiments, while operating in the gating mode, IO terminal 130 may include a voltage lower than the voltage of supply terminal 113. When an external device is coupled to IO terminal 130, such external device may drive a voltage to IO terminal 130 that may be greater than the voltage of supply terminal 113. Based on the voltage of IO terminal 130 including a value above the voltage of supply terminal 113, transistor 222 may be enabled. When enabled, transistor 222 provides a path between the control terminal of transistor 122 and IO terminal 130 to regulate control voltage 121 and increase control voltage 121 to the value of the voltage at IO terminal 130. When transistors 220 and 221 are enabled based on enable signal 111 including a value corresponding to the gating mode (e.g., 1), transistors 220 and 221 provide a path between bias generation circuit 125 and transistor 122 to regulate bias signal 126 and increase bias signal 126 to the value of the voltage of control voltage 121 (the voltage at IO terminal 130 under these conditions).

Based on the voltage of IO terminal 130 including a value below the voltage of supply terminal 113, transistor 224 may be enabled. When enabled, transistor and 224 provides a path between supply terminal 113 and transistor 122 to regulate control voltage 121 and increase control voltage 121 to the voltage of the supply power at supply terminal 113.

In some embodiments, circuit 200 includes fewer elements. In some embodiments, circuit 200 includes additional elements. For example, in some embodiments, circuit 200 includes a topology that includes fewer transistors configured to regulate control voltage 121, such as a topology of circuit 1100 of FIG. 11. In some embodiments, circuit 200 includes a topology that includes a combination of elements between circuit 200 and circuit 1100.

Figure 3:
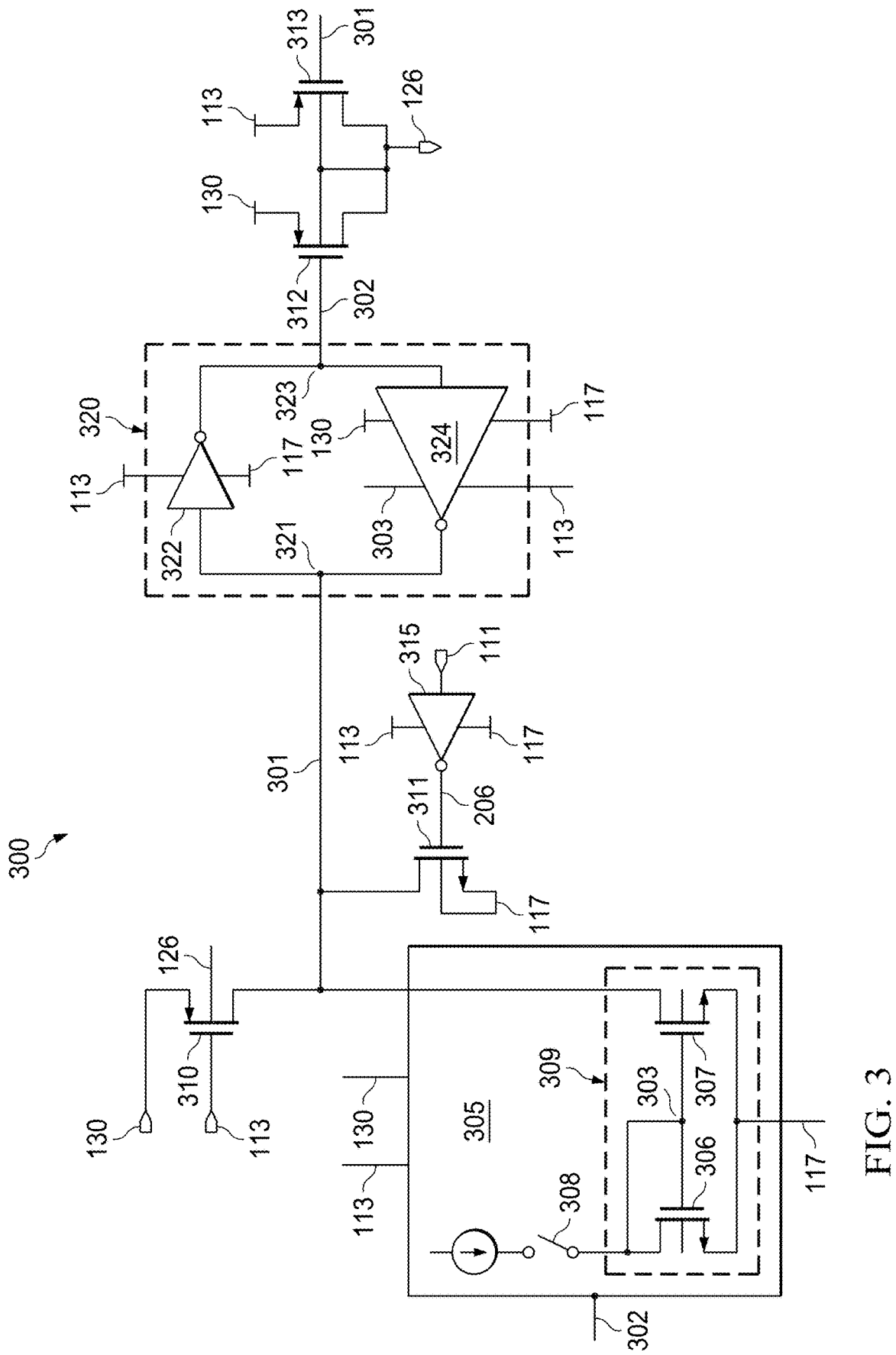
FIG. 3 illustrates an example bias generation circuit that may be used in accordance with an embodiment.

FIG. 3 illustrates a bias generation circuit 300 that may be used in accordance with an embodiment. FIG. 3 shows circuit 300, which includes pull-down circuit 305, transistors 310, 311, 312, and 313, inverter 315, latch circuit 320, and various input and output terminals that may couple to other components of a system (e.g., system 100). In some embodiments, bias generation circuit 125 may be implemented as bias generation circuit 300.

In various embodiments, circuit 300 is configured to generate bias signal 126, such that bias signal 126 includes a voltage that is a function of the maximum between the voltage at IO terminal 130 and the voltage of supply terminal 113. Circuit 300 provides bias signal 126 to a driver circuit of a system, such as driver circuit 120 of FIG. 1 or circuit 200 of FIG. 2, to control the voltage output by the driver circuit (e.g., control voltage 121) to an output transistor (e.g., transistor 122).

In circuit 300, transistor 310 is included and coupled to supply terminal 113, to IO terminal 130, to pull-down circuit 305, to transistor 311, and to latch circuit 320 (e.g., to node 321 of latch 320). In various embodiments, transistor 310 is representative of a PMOS transistor that includes a control terminal, first and second current path terminals, and a body terminal. Transistor 310 may be coupled to IO terminal 130 at the first current path terminal, to supply terminal 113 at the control terminal, to pull-down circuit 305 at the second current path terminal, and coupled to receive bias signal 126 at the body terminal.

In various embodiments, transistor 310 turns on when the voltage at IO terminal 130 exceeds the voltage of supply terminal 113. When enabled, transistor 310 produces state signal 301 that includes a value corresponding to the voltage at IO terminal 130. The value of state signal 301 may also be referenced as a binary value, and in this state, includes a value of 1. In some such embodiments, transistor 310 turns off when the voltage at IO terminal 130 falls below the voltage of supply terminal 113. Based on IO terminal 130 including a voltage below the voltage of supply terminal 113 and state signal 301 including a value of 1, pull-down circuit 305 shorts state signal 301 to reference terminal 117 for a (e.g., temporary) duration to produce state signal 301 that includes a value corresponding to reference terminal 117 (e.g., 0) if the value of state signal 301 is not currently 0. Upon state signal 301 reaching a value corresponding to the voltage at reference terminal 117 (e.g., 0), pull-down circuit 305 is disabled and latch circuit 320 receives and holds state signal 301 at 0.

In various embodiments, pull-down circuit 305 is representative of a switch-controlled current source, such as a current mirror pull-down network, configured to pull down state signal 301 to reference terminal 117 (e.g., ground) based on state signal 301 including a value of 1 (e.g., a voltage equal to the voltage at IO terminal 130) and further based on the voltage at IO terminal 130 transitioning from a voltage greater than the voltage of supply terminal 113 to a voltage less than the voltage of supply terminal 113. In such a scenario, transistor 310 turns off, pull-down circuit 305 turns on to change the value of state signal 301 from a 1 to a 0 (e.g., from the voltage at IO terminal 130 to zero), and pull-down circuit 305 turns off based on state signal 301 including a value of 0. As described above, pull-down circuit 305 stops pulling state signal 301 to the value of reference signal 117 based on state signal 301 reaching a value of 0. Based on both transistor 310 and pull-down circuit 305 being off, circuit 300 might not produce any static current from IO terminal 130 to reference terminal 117.

In some embodiments, pull-down circuit 305 includes a control terminal to control whether pull-down circuit 305 is enabled or disabled. For example, in some embodiments, pull-down circuit 305 may be disabled (and not turn on) if state signal 301 includes a value of 0. When state signal 301 includes a value of 0, inverted state signal 302 (a signal having a value opposite relative to state signal 301) includes a value of 1. When state signal 301 includes a value of 1, inverted state signal 302 includes a value of 0, and the voltage at IO terminal 130 is greater than the voltage of supply terminal 113. In this way, when state signal 301 already includes a value of 0, pull-down circuit 305 advantageously might not produce any static current as pull-down circuit 305 is disabled when state signal 301 does not need to be grounded. Further, by turning off during such times, pull-down circuit 305 advantageously might reduce dynamic current throughout circuit 300 as pull-down circuit 305 and transistor 310 might not be enabled during the same times and conflict with respect to operations related to generating state signal 301.

In some embodiments, pull-down circuit 305 includes several devices arranged in a current-mirror topology, such as switch 308 and current mirror 309, which includes transistor 306 and transistor 307, e.g., among other transistors. In some such embodiments, pull-down circuit 305 is coupled to IO terminal 130, supply terminal 113, reference terminal 117, and to an output of inverter 322 and an input of inverter 324 of latch circuit 320 (e.g., at node 323). By way of example, pull-down circuit 305 includes a topology as illustrated in and described by circuit 400 of FIG. 4.

Latch circuit 320 receives and stores values of state signal 301. In some embodiments, latch circuit 320 includes inverters 322 and 324. Inverters 322 and 324 each include an input and an output. Specifically, the input of inverter 322 may be coupled to the output of inverter 324 at node 321 and may be coupled to receive state signal 301. The output of inverter 322 may be coupled to the input of inverter 324 at node 323 and may be coupled to provide inverted state signal 302 to inverter 324, to transistor 312, and to pull-down circuit 305. Inverter 322 may also include first and second supply inputs coupled to supply terminal 113 and to reference terminal 117 (e.g., ground), respectively, and inverter 324 may also include supply inputs coupled to IO terminal 130, to reference terminal 117, to supply terminal 113, and to intermediate node 303.

Figure 5A:
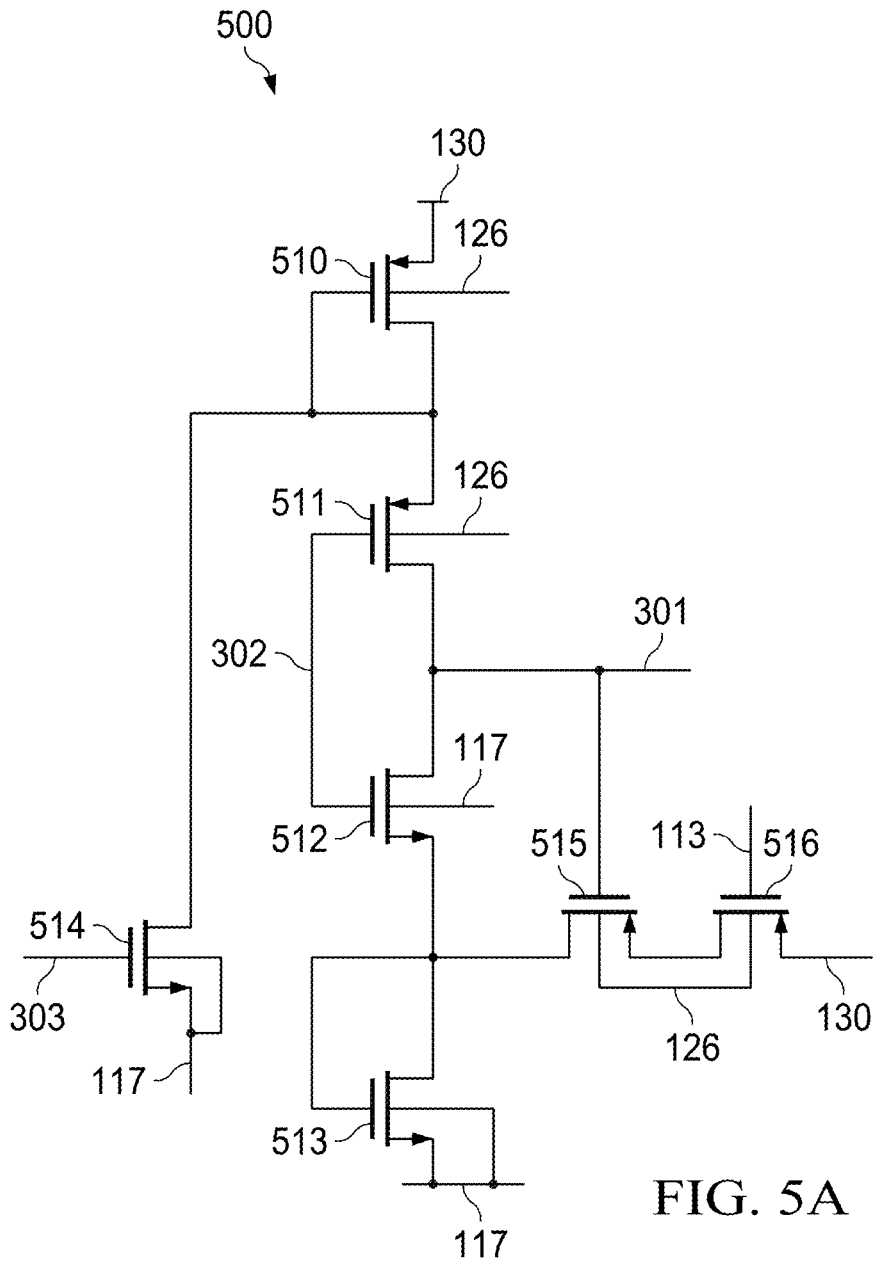
FIGS. 5A and 5B illustrate example inverters that may be used in accordance with an embodiment.

In some embodiments, inverter 324 includes several transistors arranged in a topology as illustrated by circuit 500 of FIG. 5A. In some embodiments, inverter 324 includes several transistors arranged in a different topology, such as a topology illustrated by circuit 501 of FIG. 5B. In some embodiments, latch circuit 320 includes one or more latches and/or flip-flops instead or in addition to inverters 322 and 324.

Transistor 312 may be coupled to receive inverted state signal 302 from latch circuit 320 at node 323 and may further be coupled to IO terminal 130 and to transistor 313. Transistor 313 may be coupled to receive state signal 301 and may be coupled to supply terminal 113.

In some embodiments, transistors 312 and 313 are PMOS transistors each including a control terminal, first and second current path terminals, and a body terminal. Specifically, the first current path terminal of transistor 312 may be coupled to IO terminal 130, the control terminal of transistor 312 may be coupled to receive inverted state signal 302 from latch circuit 320, the body terminal of transistor 312 may be coupled to the body terminal of transistor 313 and to the second current path terminals of transistors 312 and 313, and the second current path terminal of transistor 312 may be coupled to the second current path terminal of transistor 313 and may be coupled to elements of circuit 300 and elements of a system (e.g., system 100) to provide bias signal 126 thereto. The first current path terminal of transistor 313 may be coupled to supply terminal 113 and the control terminal of transistor 313 may be coupled to latch 320 at node 321 (e.g., to the input of inverter 322 of latch circuit 320 and to the output of inverter 324 of latch circuit 320), to transistor 310, to pull-down circuit 305, and to transistor 311.

In some embodiments, transistors 312 and 313 are included to generate and output bias signal 126 based on the value of state signal 301 and inverted state signal 302. For example, based on the value of state signal 301 including a value corresponding to the voltage of IO terminal 130 (e.g., 1), transistor 313 turns off, and transistor 312 turns on and outputs bias signal 126 having a value corresponding to the voltage at IO terminal 130. Conversely, based on the value of state signal 301 including a value corresponding to ground (e.g., 0), transistor 312 turns off, and transistor 313 turns on and outputs bias signal 126 having a value corresponding to the voltage of supply terminal 113.

In some embodiments, inverter 315 and transistor 311 are included in circuit 300 to provide redundancy and ensure that state signal 301 is pulled to ground (e.g., 0) when a driver circuit (e.g., driver circuit 120, circuit 200) is enabled in a driving mode (e.g., enable signal 111 includes a value of 0). Inverter 315 includes an input coupled to receive enable signal 111 from input control circuit 115 of FIG. 1 and an output inverted enable signal 206 to transistor 311. Inverter 315 may also be coupled to supply terminal 113 and to reference terminal 117. In some embodiments, transistor 311 is an NMOS transistor including a control terminal, a body terminal, and first and second current path terminals.

In operation, based on enable signal 111 including a value corresponding to the driving mode (e.g., 0), inverter 315 inverts enable signal and provides inverted enable signal 206 including a value of 1 to transistor 311. Based on receiving inverted enable signal 206 with a value of 1, transistor 311 turns on and shorts state signal 301 to reference terminal 117. Based on being shorted to reference terminal 117, state signal 301 includes a value of 0.

Based on enable signal 111 including a value corresponding to the gating mode (e.g., 1), inverter 315 inverts enable signal and provides inverted enable signal 206 including a value of 0 to transistor 311. Based on receiving inverted enable signal 206 with a value of 0, transistor 311 turns off. Thus, transistor 311 might not influence the value of state signal 301 when a driver circuit is disabled.

In some embodiments, circuit 300 includes fewer elements. In some embodiments, circuit 300 includes additional elements. For example, in some embodiments, circuit 300 includes a topology such as one shown in circuit 1200 of FIG. 12A or one shown in circuit 1201 of FIG. 12B. In some embodiments, circuit 300 includes a topology that includes a combination of elements between circuits 300, 1200, and/or 1201.

Figure 4:
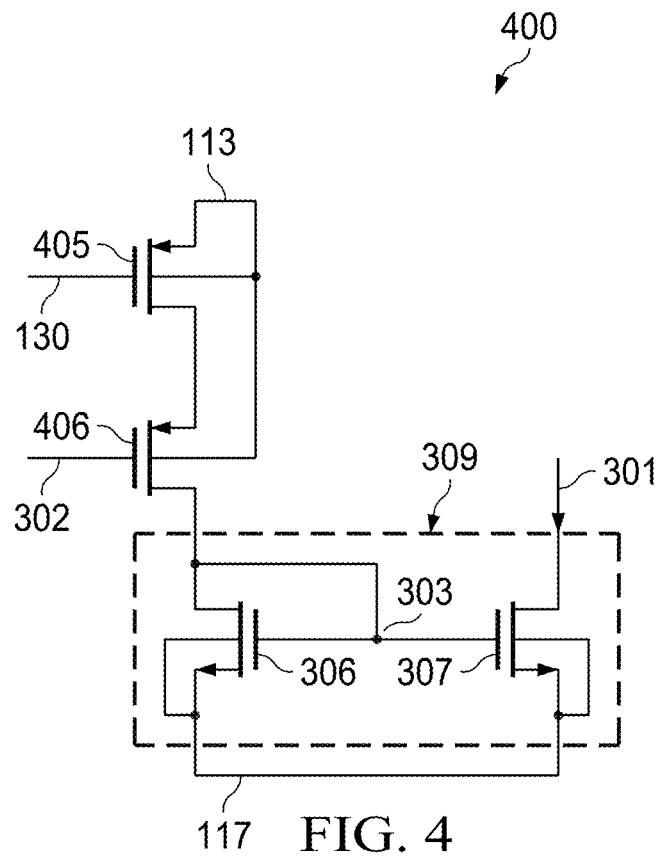
FIG. 4 illustrates an example pull-down circuit that may be used in accordance with an embodiment.

FIG. 4 illustrates a pull-down circuit 400 that may be used in accordance with an embodiment. FIG. 4 shows circuit 400, which includes transistors 405, 406, 306, and 307, and which references elements of FIGS. 1 and 3.

In various embodiments, circuit 400 is representative of a switch-controlled current source (e.g., pull-down circuit 305) configured to pull a signal (e.g., state signal 301) to ground when enabled.

In circuit 400, transistors 405, 406, and current mirror 309 that includes transistors 306, and 307 are included to enable such functionality. In some such embodiments, transistors 405 and 406 are PMOS transistors, and transistors 306 and 307 are NMOS transistors. Each of the transistors may include a control terminal, first and second current path terminals, and a body terminal. Transistor 405 may be coupled to supply terminal 113, to IO terminal 130, and to transistor 406. Transistor 406 may be coupled to a node at which inverted state signal 302 is supplied (e.g., the output of inverter 322 and the input of inverter 324) and may be coupled to transistors 306 and 307. Transistor 306 may be coupled to transistor 307 and to reference terminal 117. Transistor 307 may be coupled to a node at which state signal 301 is supplied (e.g., a current path terminal of transistor 310, the input of inverter 322, and the output of inverter 324) and may be coupled to reference terminal 117.

In operation, circuit 400 may be enabled based on state signal 301 including a value of 1 (e.g., a voltage corresponding to the voltage of supply terminal 113) and based on the voltage at IO terminal 130 falling below the voltage of supply terminal 113. Based on such occurrences, transistors 405, 406, 306, and 307 turn on and short state signal 301 to ground to cause state signal 301 to change to a value of 0.

As can be seen with respect to FIG. 3 (e.g., when circuit 305 is implemented as 400), circuit 400 may be disabled responsive to signal 301 including a value of 0. For example, in some embodiments, when signal 301 is low, signal 302 is high, which causes transistor 406 to turn off, e.g., regardless of the values of the voltages of IO terminal 130.

When state signal 301 already includes a value of 0, circuit 400 advantageously might not produce any static current as circuit 400 may be disabled when state signal 301 does not need to be grounded. Further, by turning off during such times, circuit 400 advantageously might reduce dynamic current throughout circuit 300 as circuit 400 and transistor 310 might not be enabled during the same times and conflict with respect to operations related to generating state signal 301.

In some embodiments, circuit 400 includes fewer elements. In some embodiments, circuit 400 includes additional elements. For example, in some embodiments, circuit 400 may include a topology that includes fewer transistors to regulate state signal 301, such as a subset of the elements of circuits 1200 or 1201 of FIG. 12A or 12B, respectively.

Figure 5B:
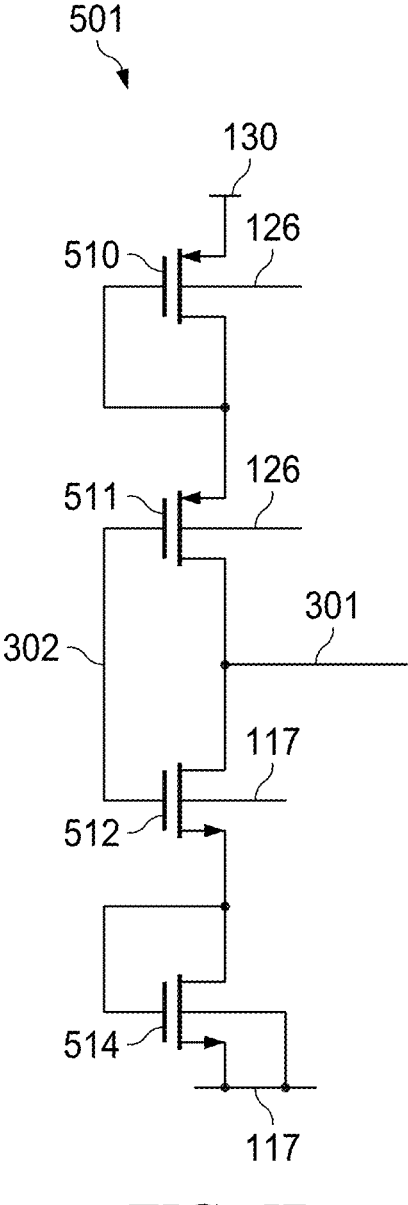

FIGS. 5A and 5B illustrate example inverter circuits that may be used in accordance with an embodiment. FIG. 5A shows circuit 500, which includes transistors 510, 511, 512, 513, 514, 515, and 516 in a cross-coupled inverter topology, and FIG. 5B shows circuit 501, which may include transistors 510, 511, 512, and 513, both of which reference elements of FIGS. 1 and 3.

In various embodiments, inverter 324 may be implemented as inverter 500 or inverter 501.

Referring first to circuit 500 of FIG. 5A, circuit 500 includes transistors 510, 511, 512, 513, 514, 515, and 516 coupled together in a first topology. In some embodiments, transistors 510, 511, 515, and 516 are PMOS transistors, and transistors 512, 513, and 514 are NMOS transistors. Each of the transistors may include a control terminal, first and second current path terminals, and a body terminal.

Transistor 510 may be coupled to IO terminal 130, to transistor 514, and transistor 511, and may be coupled to receive bias signal 126. Transistor 514 may be coupled to intermediate node 303 (e.g., a terminal of pull-down circuit 305, e.g., a terminal between the control terminals of transistors 306 and 307 of pull-down circuit 305 or of circuit 400) and to reference terminal 117. Transistor 511 may be coupled to transistor 512, may be coupled to receive inverted state signal 302 and bias signal 126, and may be coupled to output state signal 301. Transistor 512 may be coupled to transistors 513 and 515 and to reference terminal 117, may be coupled to receive inverted state signal 302, and may be coupled to output state signal 301. Transistor 513 may be coupled to transistor 515 and to reference terminal 117. Transistor 515 may be coupled to transistor 516, to current path terminals of transistors 511 and 512 at the control terminal of transistor 515 to receive state signal 301, to a bias generation circuit (e.g., circuit 300) to receive bias signal 126. Transistor 516 may be coupled to supply terminal 113, to IO terminal 130, and to the bias generation circuit to receive bias signal 126.

In operation, transistors 514, 515 and 516 may weaken the strength of the transistors responsible for latching and inverting values of state signal 301 (e.g., transistors 510, 511, 512, and 513) during transitions of state signal 301 from a logical low state (e.g., 0) to a logical high state (e.g., 1) and from the logical high state to the logical low state.

By way of example, during a transition of state signal 301 from 0 to 1, based on the voltage at IO terminal 130 transitioning from a voltage below the voltage of supply terminal 113 to a voltage higher than the voltage of supply terminal 113 and based on state signal 301 including a value of 0, transistors 515 and 516 turn on and provide a voltage to a terminal where transistors 512, 513, and 515 connect (e.g., a terminal where a second current path terminal of transistor 512 is coupled to a first current path terminal of transistor 513 and to a first current path terminal of transistor 515). Based on providing this voltage to this terminal, the gate-to-source voltage (Vas) of transistor 512 is reduced and weakens transistor 512, which may allow for an easier transition of state signal 301 from 0 to 1 based on the voltage at IO terminal 130 exceeding the voltage of supply terminal 113 by a threshold amount. In some embodiments, this threshold amount includes a smaller value than existing IO solutions based on the weakening of transistor 512. Advantageously, circuit 500 may reduce the amount of dynamic current produced by elements of a system described herein, such as system 100 and various elements thereof.

By way of another example, during a transition of state signal 301 from 1 to 0, based on voltage at IO terminal 130 transitioning from a voltage above the voltage of supply terminal 113 to a voltage below the voltage of supply terminal 113 and based on state signal 301 including a value of 1, pull-down circuit 305 turns on, which may introduce a non-zero voltage at intermediate node 303 coupled at the control terminal of transistor 514. Based on these conditions, transistor 510 is on, and transistor 514 may also turn on and cause the voltage drop at a terminal where transistors 510, 514, and 511 are coupled together to fall below the voltage at IO terminal 130. In this way, transistor 511 receives a smaller voltage (e.g., source to gate voltage ($V_{SG}$)) from transistor 510 than the voltage at IO terminal 130 and is weakened to allow for an easier transition of state signal 301 from 1 to 0 based on the voltage at IO terminal 130 falling below the voltage of supply terminal 113 by a threshold amount. In some embodiments, this threshold amount includes a smaller value than existing IO solutions based on the weakening of transistor 511. Advantageously, circuit 500 may reduce the amount of dynamic current produced by elements of a system described herein, such as system 100 and various elements thereof.

Referring next to circuit 501 of FIG. 5B, circuit 501 is similar to circuit 500. Circuit 501, however, does not include transistors 514, 515, and 516, and thus, circuit 501, which may result in a smaller implementation compared to circuit 500.

Figure 6:
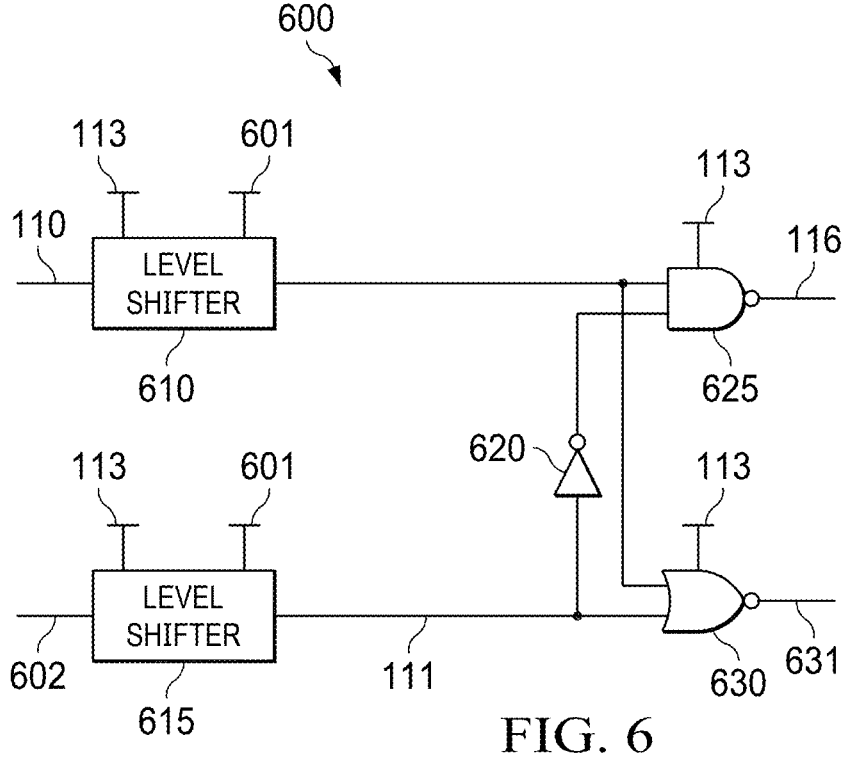
FIG. 6 illustrates an example input control circuit that may be used in accordance with an embodiment.

FIG. 6 illustrates an example input control circuit that may be used in accordance with an embodiment. FIG. 6 shows circuit 600, which includes level shifter 610, level shifter 615, inverter 620, logic gate 625, and logic gate 630, and references elements of FIG. 1.

In some embodiments, circuit 600 is representative of an input control circuit capable of receiving input signals and providing inputs to latter stages of an input-output circuit, such as system 100 of FIG. 1. In some embodiments, input control circuit 115 may be implemented as circuit 600.

In some embodiments, level shifters 610 and 615 are representative of circuits capable of converting input signals from a first voltage domain to a second voltage domain for use by other elements of the circuit or for use by elements, devices, and systems downstream relative to circuit 600. In particular, level shifter 610 receives input signal 110 and converts input signal 110 from a first voltage domain to a second voltage domain (e.g., a voltage domain corresponding to supply terminal 113) for output to logic gates 625 and 630. Level shifter 615 receives enable signal 602 and converts enable signal 602 from the first voltage domain to the second voltage domain for output to logic gates 625 and 630. Level shifters 610 and 615 may be implemented in any way known in the art.

In some embodiments, inverter 620, logic gate 625, and logic gate 630 are representative of devices or circuits capable of receiving input signals and outputting signals based on the input signals by performing respective logical operations on the input signals (e.g., digital combination logic circuits). For example, inverter 620 receives enable signal 111, inverts the value of enable signal 111, and provides the inverted value to logic gate 625. In some embodiments, logic gate 625 is representative of a NOT AND (NAND) gate. Logic gate 625 receives input signals from level shifter 610 and from inverter 620 and outputs input signal 116 based on logical values of the received input signals (e.g., to driver circuit 120 of system 100). In some embodiments, logic gate 630 is representative of a NOT OR (NOR) gate. Logic gate 630 receives input signals from level shifters 610 and 615 and outputs signal 631 based on logical values of the received input signals (e.g., to transistor 123 of system 100). Inverter 620 and logic gates 625 and 630 may be implemented in any way known in the art.

Figure 7:
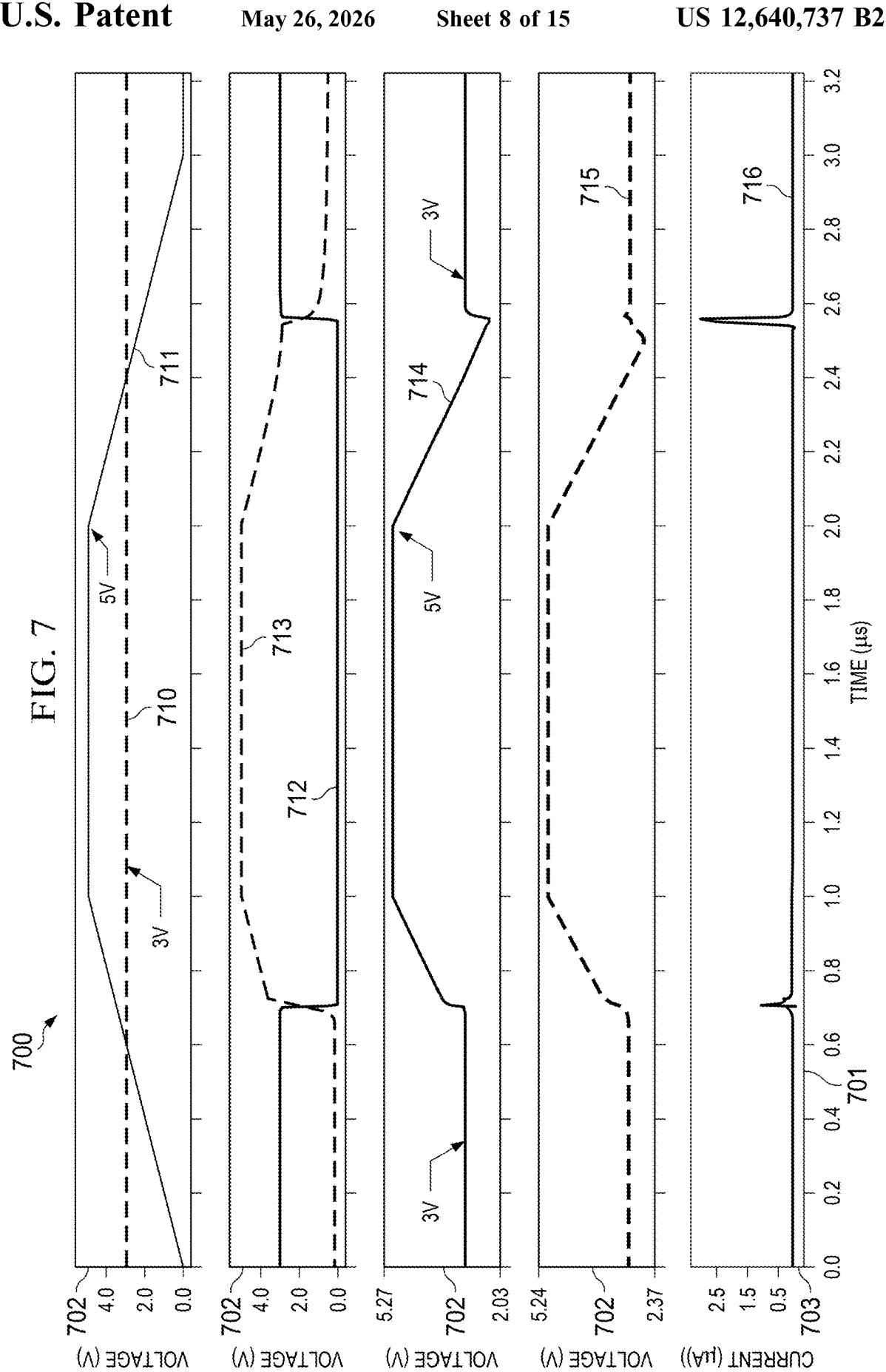
FIGS. 7, 8, 9, and 10 illustrate graphical representations of signals produced by an IO circuit and components thereof in accordance with an embodiment.
Figure 8:
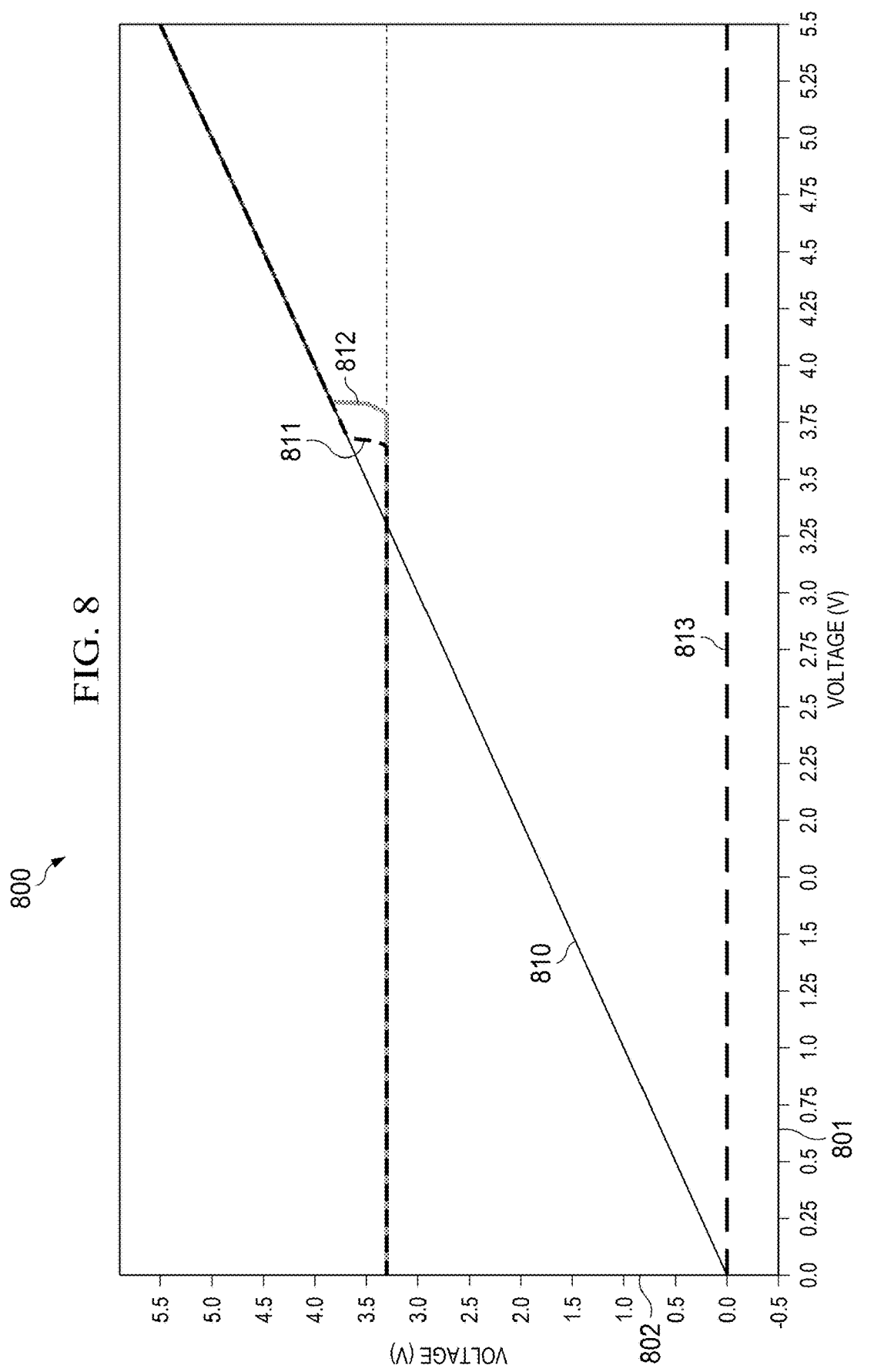
Figure 9:
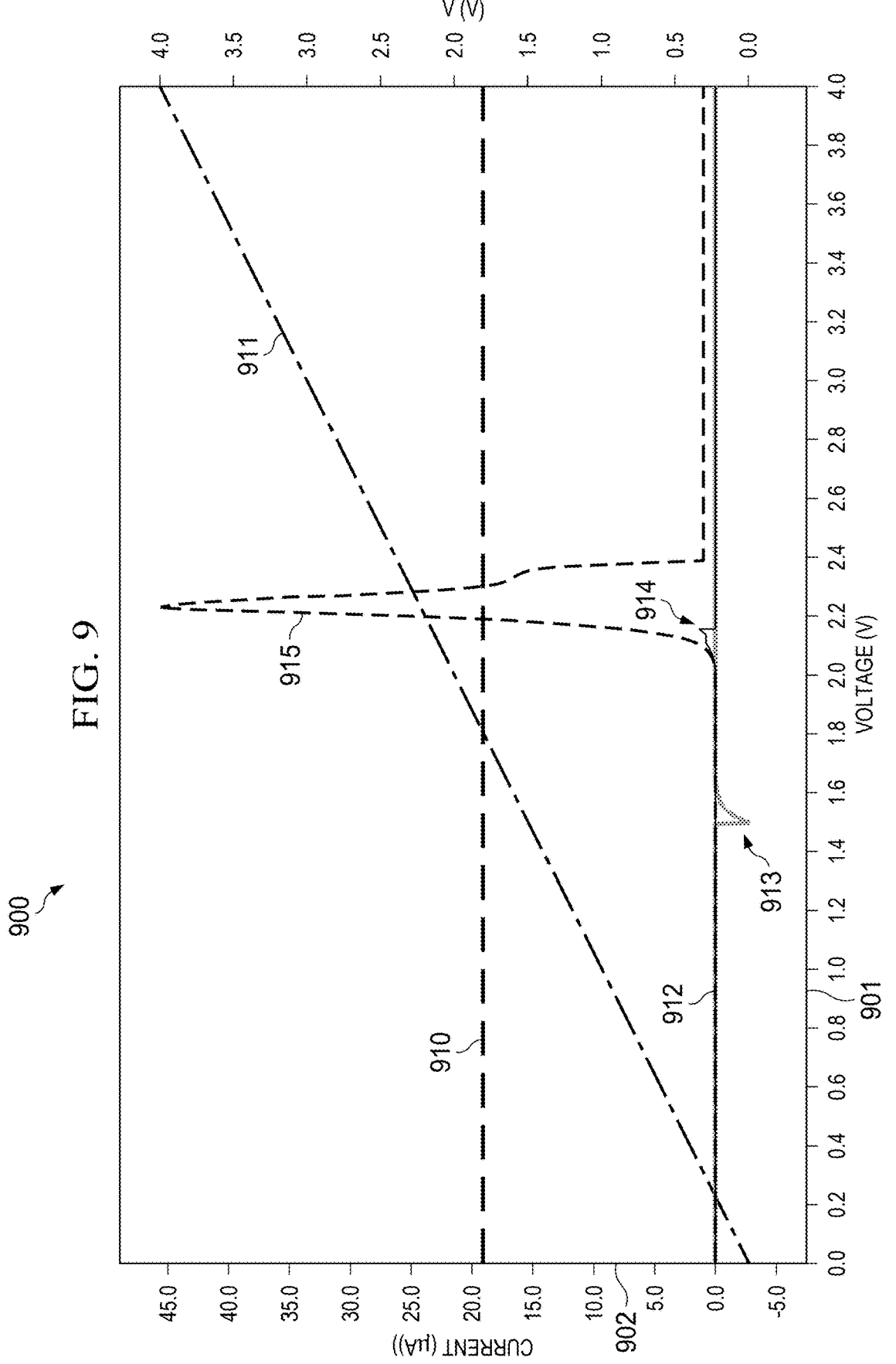
Figure 10:
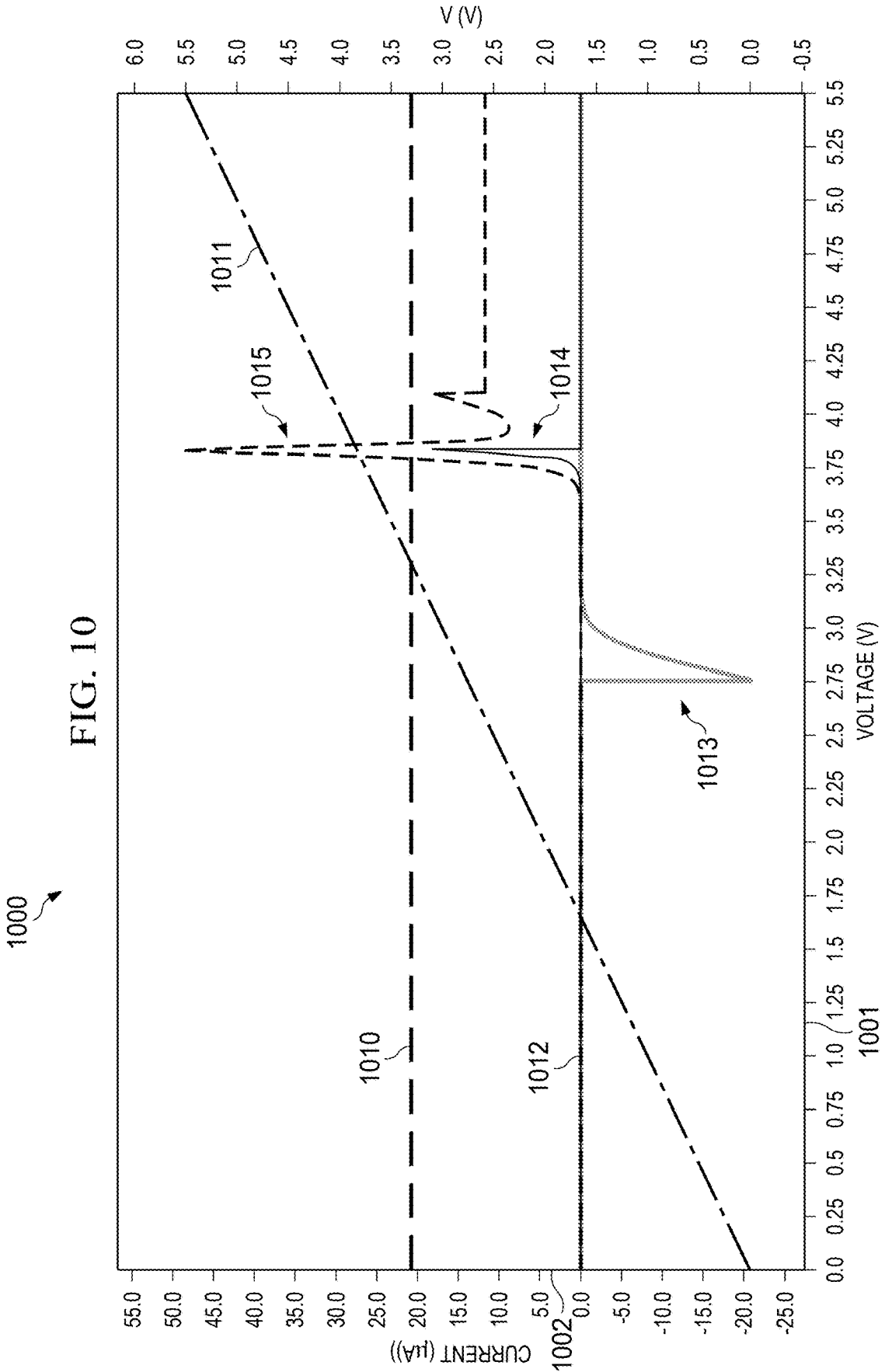

FIGS. 7, 8, 9, and 10 illustrate graphical representations of signals produced by an IO circuit and components thereof in accordance with an embodiment. FIG. 7 includes graphical representation 700, which includes waveforms including output results relative to voltage 702 or current 703 with respect to time 701, and which references elements of FIGS. 1, 2, and 3. FIG. 8 includes graphical representation 800, which includes waveforms including output results relative to voltage 801 and voltage 802, and which references elements of FIGS. 1 and 2. FIG. 9 includes graphical representation 900, which includes waveforms including output results relative to voltage 901 and current 902, and which references elements of FIGS. 1, 11, and 12A. FIG. 10 includes graphical representation 1000, which includes waveforms including output results relative to voltage 1001 and current 1002, and which references elements of FIGS. 1, 11, and 12B.

Referring first to FIG. 7, graphical representation 700 includes waveforms 710, 711, 712, 713, 714, 715, and 716 across time 701. Waveforms 710, 711, 712, 713, 714, and 715 include values corresponding to voltage 702 measured at elements or terminals of a system (e.g., system 100) during operation thereof, and waveform 716 includes values corresponding to current 703 measured at an element or a terminal of a system during operation thereof. More specifically, waveform 711 may correspond to a voltage of IO terminal 130 of circuit 100, waveform 710 may correspond to a voltage of supply terminal 113 of circuit 100, waveform 713 may correspond to a voltage of state signal 301 of circuit 300, waveform 712 may correspond to a voltage of inverted state signal 302 of circuit 300, waveform 714 may correspond to a voltage of bias signal 126 of circuit 100, waveform 715 may correspond to a voltage of control voltage 121 of circuit 100, and waveform 716 may correspond to a current of pull-down circuit 305 of circuit 300.

As illustrated by graphical representation 700, when the voltage of IO terminal 130 (e.g., waveform 711) is below the voltage of supply terminal 113 (e.g., waveform 710), the voltage of state signal 301 (e.g., waveform 713) may be grounded (e.g., 0 V), and the voltage of inverted state signal 302 (e.g., waveform 712), the voltage of bias signal (e.g., waveform 714), and the voltage of control voltage 121 (e.g., waveform 715) may include the same voltage as supply terminal 113 (e.g., 3 V). During this time, the current drawn by pull-down circuit 305 (e.g., waveform 716) may be zero as pull-down circuit 305 may be off.

When the voltage of IO terminal 130 exceeds the voltage of supply terminal 113 by a threshold amount (e.g., shown at approximately 0.7 microseconds ($\mu$s)), the voltages of state signal 301, bias signal 126, and control voltage 121 may increase to match the voltage of IO terminal 130 while the voltage of inverted state signal 302 may be pulled to ground. During this time, transistor 310 may turn on to pull state signal 301 to the voltage of IO terminal 130, and pull-down circuit 305 may draw a small amount of current (e.g., dynamic pin leakage current). Based on the value of state signal 301 and the value of state signal 302, transistor 312 of circuit 300 turns on and pulls bias signal 126 to the voltage of IO terminal 130, and consequently, transistors 220, 221, and 222 of circuit 200 turn on to pull control voltage 121 to the voltage of bias signal 126, or IO terminal 130. State signal 301, bias signal 126, and control voltage 121 may include the same or similar voltages as IO terminal 130 unless and until the voltage of IO terminal 130 falls below the voltage of supply terminal 113 beyond a threshold amount (e.g., shown at approximately 2.55 $\mu$s).

When the voltage of IO terminal 130 falls below the voltage of supply terminal 113 beyond the threshold amount, transistor 310 turns off and pull-down circuit 305 turns on to pull state signal 301 to ground. Inverted state signal 302 is then pulled to the voltage of supply terminal 113 causing transistor 312 to turn off and transistor 313 to turn on to pull bias signal 126 to the voltage of supply terminal 113. Control voltage 121 is pulled to the voltage of supply terminal 113 by transistors 223 and 224. During this transition time, as pull-down circuit 305 turns on, a spike in current may be drawn by pull-down circuit 305. After pull-down circuit 305 pulls state signal 301 to ground and latch circuit 320 produces inverted state signal 302 including a voltage of the supply terminal 113, pull-down circuit 305 may turn off and might not draw any (static) current. State signal 301 may then be held to ground (e.g., to a value of reference terminal 117) (i.e., latched) by inverter 324 based on the input to inverter 324 including inverted state signal 302 having a value of supply terminal 113.

Referring next to FIG. 8, graphical representation 800 includes waveforms 810, 811, 812, and 813. Waveforms 810, 811, 812, and 813 include values corresponding to voltage measured at elements or terminals of a system (e.g., system 100) during operation thereof. More specifically, waveform 810 may correspond to a voltage of IO terminal 130 of circuit 100, waveform 811 may correspond to a voltage of a control terminal of transistor 122 (e.g., control voltage 121) of circuit 100, waveform 812 may correspond to a voltage output by a bias generation circuit (e.g., bias generation circuit 125) (e.g., bias signal 126) of circuit 100, and waveform 813 may correspond to a logical state of inverted enable signal 206 based on enable signal 111.

As illustrated by graphical representation 800, when enable signal 111 includes a value of 1 corresponding to a gating mode of driver circuit 120, and thus, inverted enable signal 206 includes a value of 0 (e.g., waveform 813), elements of system 100 produce control voltage 121 (e.g., waveform 811) and bias signal 126 (e.g., waveform 812) with a voltage that is a function of the maximum voltage between the voltage at IO terminal 130 (e.g., waveform 810) and the voltage of supply terminal 113 (e.g., approximately 3.3 V). Accordingly, when the voltage of IO terminal 130 is below the voltage of supply terminal 113, the voltages of control voltage 121 and bias signal 126 may include a voltage equal to the voltage of supply terminal 113, and when the voltage of IO terminal 130 exceeds the voltage of supply terminal 113, the voltages of control voltage 121 and bias signal 126 may include a voltage equal to the voltage at IO terminal 130.

Referring to FIG. 9, graphical representation 900 includes waveforms 910, 911, 912, and 915. Waveforms 910 and 911 include values corresponding to voltage measured at elements or terminals of a system (e.g., system 100) during operation thereof, and waveforms 912 and 915 include values corresponding to current measured at elements or terminals of the system during operation thereof. More specifically, waveform 910 may correspond to a voltage of supply terminal 113 of circuit 100. Waveform 911 may correspond to a voltage of IO terminal 130 of circuit 100. Waveform 912 may correspond to a current of IO terminal 130 when driver circuit 120 includes elements of circuit 200 and bias generation circuit 125 includes elements of circuit 300, among other circuits. Waveform 912 also includes current spikes 913 and 914, which may represent spikes of current measured at IO terminal 130 that may occur during transitions when the voltage at IO terminal 130 falls below the voltage of supply terminal 113, and when the voltage at IO terminal exceeds the voltage of supply terminal 113, respectively. Waveform 915 may correspond to a current of IO terminal 130 when driver circuit 120 includes elements of circuit 1100 and bias generation circuit 125 includes elements of circuit 1200. In some such embodiments, when using elements of circuits 1100 and 1200, current spikes measured at IO terminal 130 may be larger relative to current spikes 913 and 914.

Referring to FIG. 10, graphical representation 1000 includes waveforms 1010, 1011, and 1012. Waveforms 1010 and 1011 include values corresponding to voltage measured at elements or terminals of a system (e.g., system 100) during operation thereof, and waveform 1012 includes values corresponding to current measured at elements or terminals of the system during operation thereof. More specifically, waveform 1010 may correspond to a voltage of supply terminal 113 of circuit 100. Waveform 1011 may correspond to a voltage of IO terminal 130 of circuit 130. Waveform 1012 may correspond to a current of IO terminal 130 when driver circuit 120 includes elements of circuit 200 and bias generation circuit 125 includes elements of circuit 300, among other circuits. Waveform 1012 shows current spike 1013 and 1014, which may represent spikes in current measured at IO terminal 130 during transitions when the voltage of IO terminal 130 falls below the voltage of supply terminal 113, and when the voltage of IO terminal 130 exceeds the voltage of supply terminal 113, respectively. FIG. 10 also shows waveform 1015, which may correspond to a current of IO terminal 130 when driver circuit 120 includes elements of circuit 1100 and bias generation circuit 125 includes elements of circuit 1201. In some such embodiments, when using elements of circuits 1100 and 1201, current spikes measured at IO terminal 130 may be larger relative to current spikes 1013 and 1014.

In reference to both FIGS. 9 and 10, it can be seen that in systems using elements and topologies of circuits 200 and 300, the current of IO terminal 130 (e.g., waveforms 912 and 1012) may include smaller spikes in current during transitions when the voltage of IO terminal 130 goes above and below the voltage of supply terminal 113 relative to the spikes in current of IO terminal 130 (e.g., waveforms 913 and 1013) when a system uses elements and topologies of circuits 1100 and 1200 or 1201. Further, such systems using elements and topologies 200 and 300 might not produce static current following one or more of the transitions (e.g., when IO terminal 130 increase to a voltage above the voltage of supply terminal 113), such as a static current as illustrated by waveform 913 at and beyond 2.4 V of voltage 901 and by waveform 1013 at and beyond approximately 4.1 V of voltage 1001.

Figure 11:
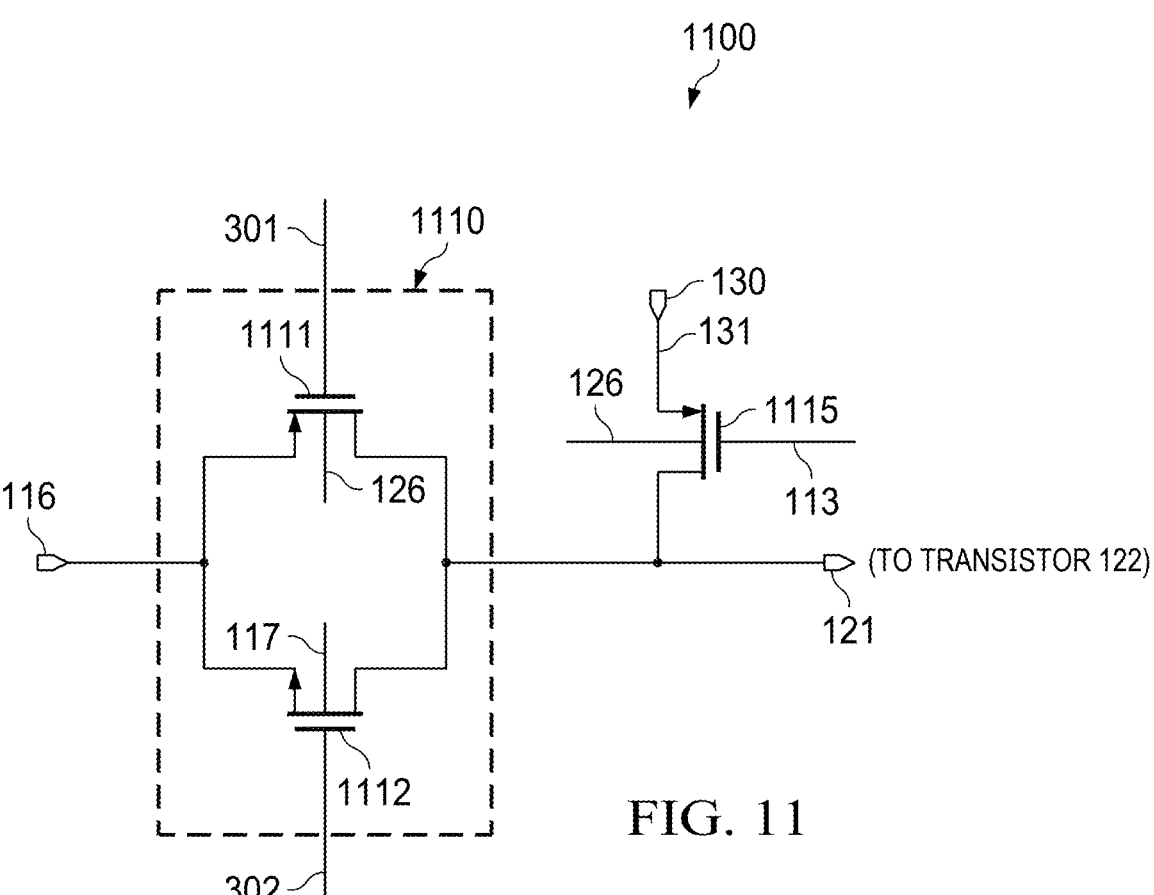
FIG. 11 illustrates an example driver circuit that may be used in accordance with an embodiment.

FIG. 11 illustrates an example driver circuit that may be used in accordance with an embodiment. FIG. 11 shows circuit 1100, which includes transmission gate 1110 and transistor 1115, and which references elements of FIGS. 1 and 3.

In some embodiments, circuit 1100 is representative of a possible implementation of driver 120 to drive signal 131. In some embodiments, driver 1100 may used in a system such as system 100, e.g., when such system implements bias generation circuit 125 as 300.

In operation, transmission gate 1110 may be enabled when state signal 301 includes a logical low value (e.g., 0, e.g., state signal 301 is grounded), and thus, the voltage at IO terminal 130 is less than or equal to the voltage of supply terminal 113. When enabled, transmission gate 1110 may receive input signal 116 and provide signal 131 to transistor 122. Transistor 1115 might be disabled when state signal 301 includes the logical low value.

Transmission gate 1110 may be disabled when state signal 301 includes a logical high value (e.g., 1, e.g., state signal 301 includes a value corresponding to the voltage of IO terminal 130) and thus, the voltage at IO terminal 130 is greater than the voltage of supply terminal 113. When disabled, transmission gate 1110 might be in high impedance, and the value of signal 131 may be determined by transistor 1115 (e.g., which may be on and pulling signal 131 high to turn off transistor 122).

Figure 12A:
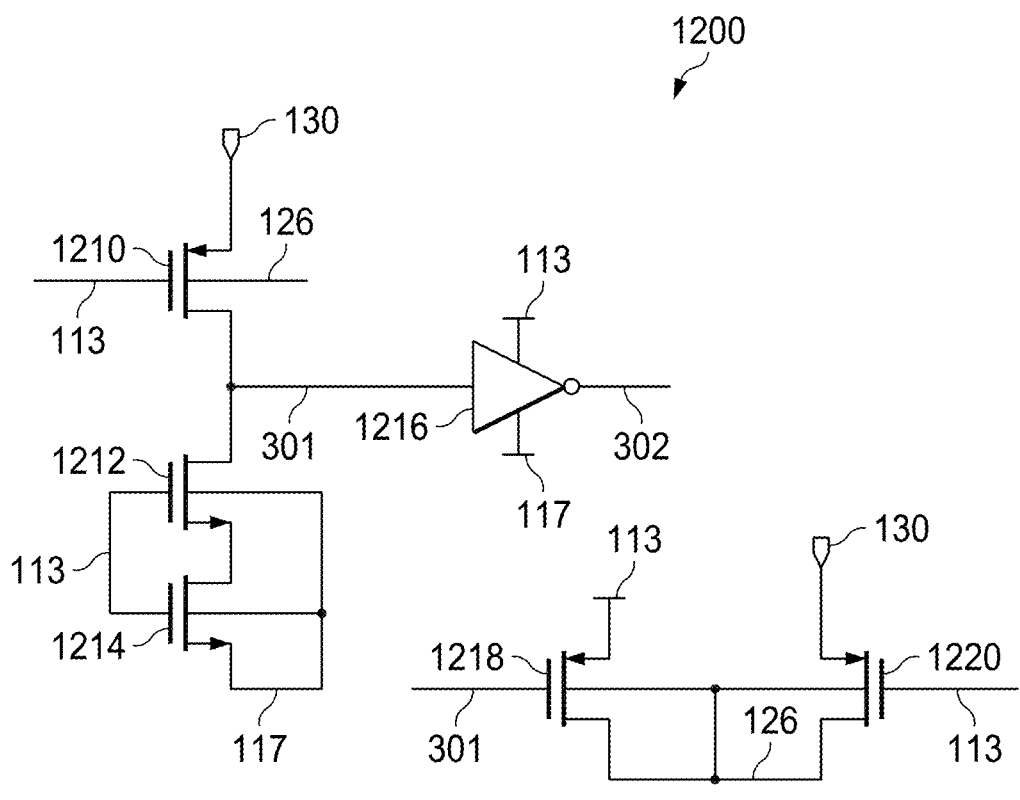
FIGS. 12A and 12B illustrate example bias generation circuits that may be used in accordance with an embodiment.
Figure 12B:
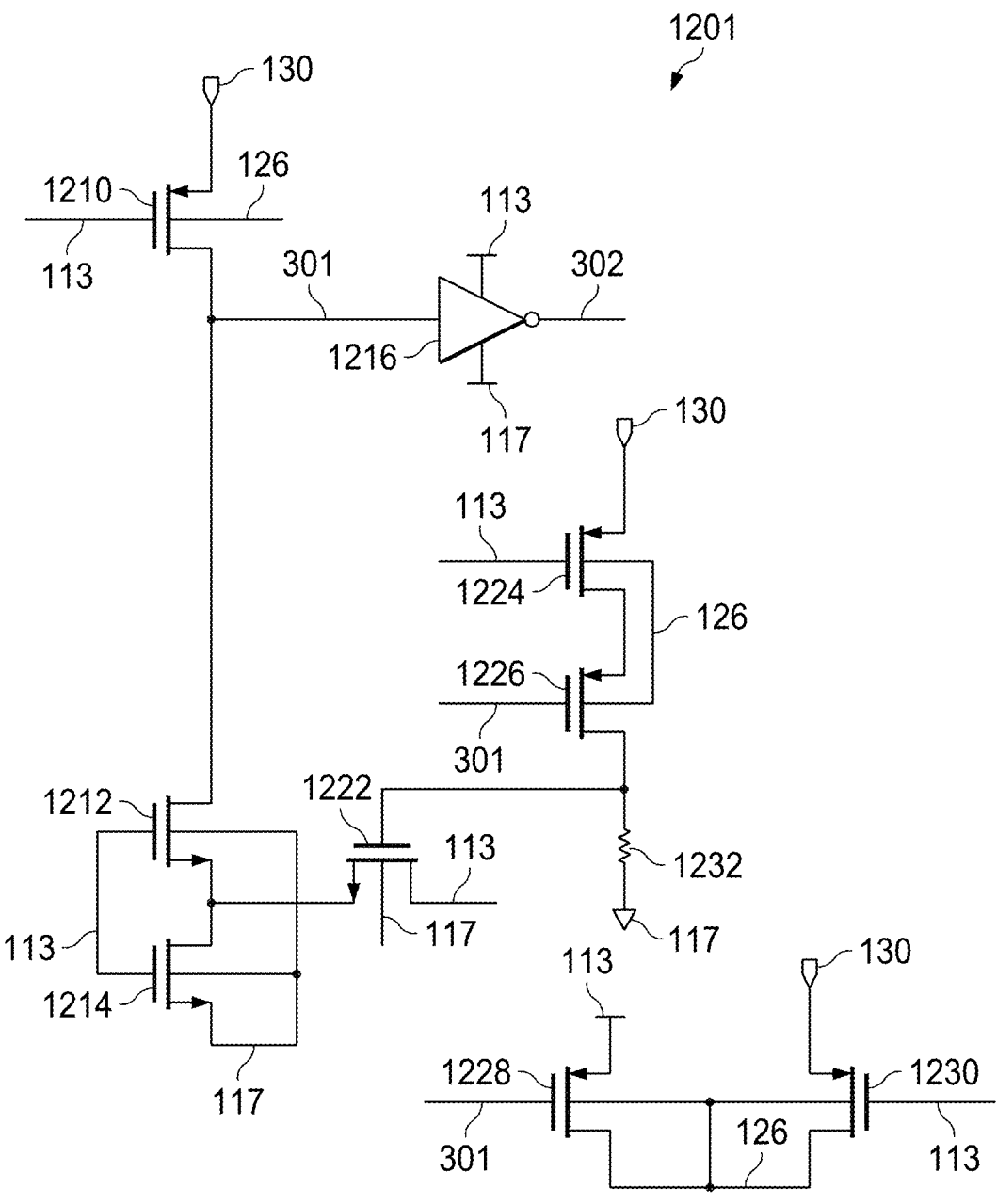

FIGS. 12A and 12B illustrate example bias generation circuits that may be used in accordance with an embodiment. FIG. 12A includes circuit 1200, which may include transistors 1210, 1212, 1214, 1218, and 1220 and inverter 1216, and which may reference elements of FIGS. 1 and 3. FIG. 12B includes circuit 1201, which may include transistors 1210, 1212, 1214, 1222, 1224, 1226, 1228, and 1230, inverter 1216, and resistor 1232, and which may reference elements of FIGS. 1, 3, and 12A.

In some embodiments, bias generation circuit 125 may be implemented as circuits 1200 or 1201. For example, in an embodiment, bias generation circuit 125 may be implemented as 1200 or 1201 while driver 120 may be implemented as 200.

Referring first to circuit 1200 of FIG. 12A, in operation, based on the voltage at IO terminal 130 exceeding the voltage of supply terminal 113, transistor 1210 may turn on and produce state signal 301 with a voltage corresponding to the voltage at IO terminal 130. Based on the voltage at IO terminal 130 falling below the voltage of supply terminal 113, transistor 1210 may turn off, and transistors 1212 and 1214 may turn on to pull state signal 301 to reference terminal 117 (e.g., 0).

Inverter 1216 may be included to invert state signal 301 to produce inverted state signal 302 and provide inverted state signal 302 to other elements of the system, such as the driver circuit.

Transistors 1218 and 1220 may receive state signal 301 and the supply voltage from supply terminal 113, respectively, and turn on based on the voltage at IO terminal 130 to generate bias signal 126.

Referring next to circuit 1201 of FIG. 12B, in operation, circuit 1201 functions similarly relative to circuit 1200 but includes additional elements to reduce dynamic current produced by elements of the circuit. Specifically, transistors 1224, 1226, and 1222 may be included and may turn on in some situations to weaken transistor 1212. Transistor 1224 may turn on based on the voltage at IO terminal 130 transitioning to a voltage above the voltage of supply terminal 113, transistor 1226 may turn on based on state signal 301 including a value corresponding to ground, and transistor 1222 may turn on based on transistors 1224 and 1226 turning on. As transistor 1222 turns on while both transistors 1212 and 1214 are on, a non-zero voltage is produced at a node between current path terminals of transistors 1212 and 1214, which may reduce a voltage (e.g., the gate-to-source voltage (Vas)) of transistor 1212 and weaken transistor 1212 and ultimately weaken the strength of the pull-down network formed by transistors 1212 and 1214.

Figure 13:
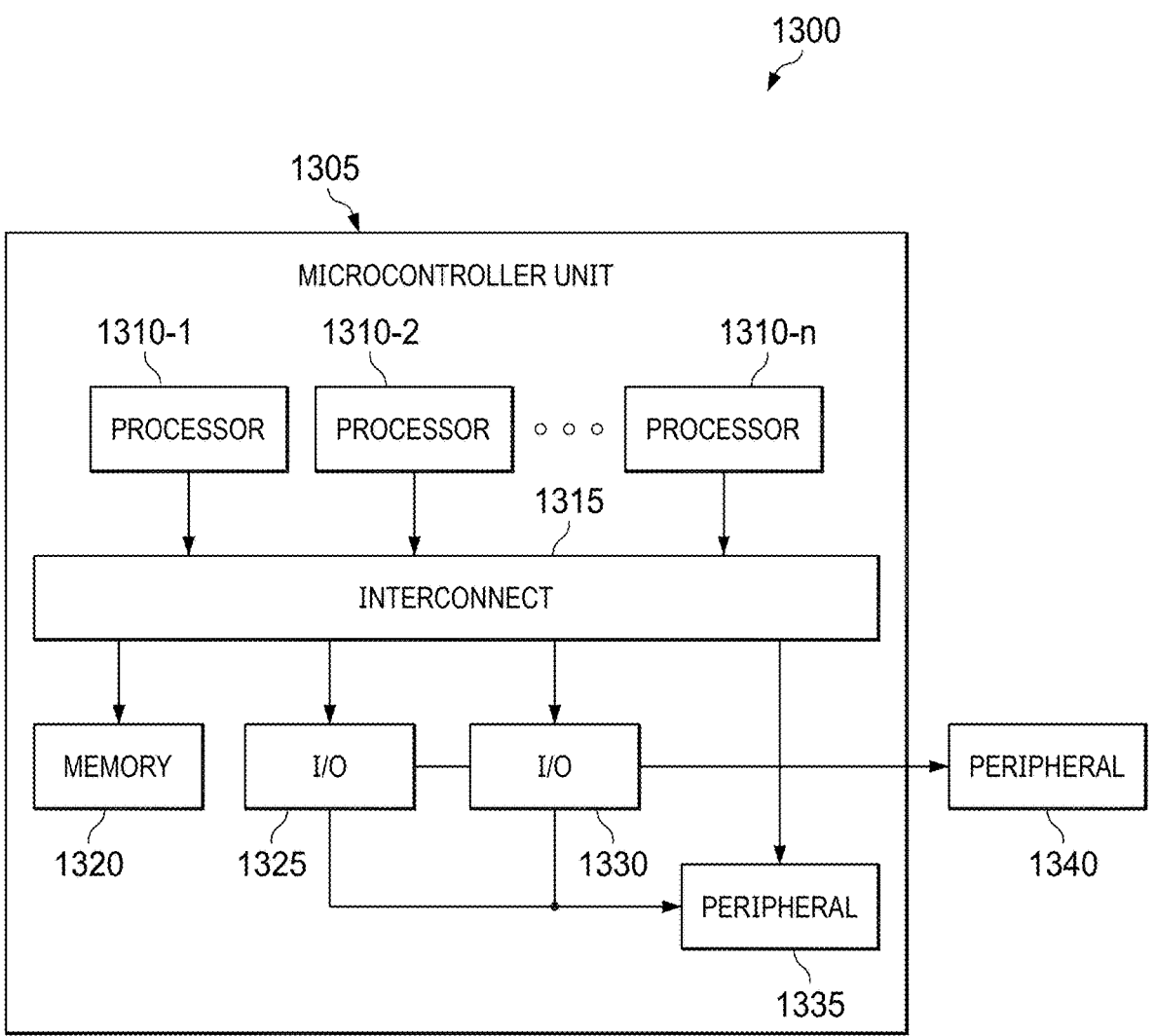
FIG. 13 illustrates an example system that may be used in accordance with an embodiment.

FIG. 13 illustrates an example system that may be used in accordance with an embodiment. FIG. 13 shows system 1300, which includes microcontroller unit (MCU) 1305, components thereof, and peripheral 1340. Microcontroller unit 1305 includes processors 1310-1, 1310-2, and 1310-*n* (collectively processors 1310), interconnect 1315, memory 1320, input-outputs (IOs) 1325 and 1330, and peripheral 1335.

In various embodiments, system 1300 is representative of a processing system that includes various hardware, software, and firmware elements configured to execute program instructions and to enable functionality based on the execution thereof. In various examples, the elements of system 1300 are onboard a chip (i.e., a system-on-chip (SoC)). In some examples, some elements may be located off-chip relative to other elements onboard the chip, such as peripheral 1340. System 1300 may be coupled with one or more peripherals that can obtain data from elements of system 1300, such as from executions of application code, to enable functionality of the one or more peripheral devices.

In some embodiments, processors 1310 is representative of one or more processors, processing cores, or processing circuitry capable of executing software and firmware, such as program instructions (e.g., application code, loadable instructions, read-only data, execute-in-place XIP) code, and the like). Such processor(s) may include microcontrollers, digital signal processors (DSPs), general purpose processing units, central processing units (CPUs), application specific processors or circuits (e.g., ASICs), and logic devices (e.g., FPGAs), as well as other types of processing devices, combinations, or variations thereof. In various examples, processors 1310 may attempt to access memory 1320, among other memory devices internal to or external to MCU 1305, via interconnect 1315 to read from or write to memory 1320.

In some embodiments, memory 1320 is representative of computer-readable storage media located on MCU 1305. For example, memory 1320 is representative of a random access memory (RAM), tightly-coupled memory (TCM), or another type of memory. Although only one block is illustrated in system 1300, memory 1320 may be implemented as multiple memories functioning in an integrated or separate manner. Memory 1320 may store program instructions and data. The program instructions may include application code, such as instructions that, when executed by processors 1310, enable functionality. The data may include results and/or other information related to the program instructions, loadable instructions, XIP code, or the like. Processors 1310 may access memory 1320 via interconnect 1315 to execute code thereon.

In some embodiments, IOs 1325 and 1330 may be included in MCU 1305 to transmit or receive signals to/from one or more peripherals (e.g., 1335 in the embodiment of FIG. 13). In some embodiments, each of IOs 1325 and 1330 may be implemented as IO cell 100, which may ensure failsafe and tolerant behavior without producing static IO terminal current and/or with reduced dynamic current as described herein.

In some embodiments, IOs 1325 and 1330 may operate in one of several modes, including a transmitting mode (e.g., push-pull and/or open-drain), a receiving mode, or an off mode. In the transmitting mode, IOs 1325 and 1330 may utilize a transmitting path (e.g., a path including transistors 122 and 123) to drive signals from MCU 1305 to one or more of peripherals 1335 and 1340. In the receiving mode, IOs 1325 and 1330 may utilize a receiving path (e.g., a path including amplifier 135) to receive signals from one or more of peripherals 1335 and 1340. In the off mode, IOs 1325 and 1330 may prevent signals from being transmitted and may ignore or block signals received at IO terminal 130 while preventing peripherals 1335 and 1340 from injecting current into IOs 1325 and 1330. IOs 1325 and 1330 may operate in any combination of modes. For example, when IO 1325 operates in the transmitting or receiving mode, one or more of peripherals 1335 or 1340 or IO 1325 itself may provide current to IO 1330. In such embodiments, IO 1330 may operate in a gating mode to prevent current flowing from peripherals 1335 or 1340 from flowing through IO 1330.

In some embodiments, peripherals 1335 and 1340 is representative of peripheral devices capable of executing functions on data input via one or more of IOs 1325 and 1330. Examples of peripherals 1335 and 1340 may include hardware accelerators, signal conversion circuits (e.g., analog-to-digital converters, digital-to-analog converters), radio frequency circuits (e.g., transmitters, receivers, transceivers), and the like. In some such embodiments, peripherals 1335 and 1340 may be supplied with power from a power supply different than the power supply that supplies power to IOs 1325 and 1330. In some such embodiments, if one or more of peripherals 1335 and 1340 is operating while a coupled IO is inactive, or not in a driving mode, the IO may be susceptible to drawing current from a peripheral, which may damage the power supply of the IO. However, as disclosed herein, IOs 1335 and 1340 may include circuitry configured to prevent current from flowing from peripherals 1335 and/or 1340 to respective power supplies of IOs 1335 and 1340 as described herein.

Example embodiments of the present disclosure are summarized here. Other embodiments can also be understood from the entirety of the specification and the claims filed herein.

Example 1. An electronic circuit including: an input-output (IO) terminal; a supply terminal; a reference terminal; a high-side transistor having a current path coupled between the supply terminal and the IO terminal; a low-side transistor having a current path coupled between the IO terminal and the reference terminal; a driver having an input and an output, the output of the driver coupled to a control terminal of the high-side transistor; and a bias generation circuit having an output coupled to a bulk terminal of the high-side transistor; where the driver includes: a first inverter having an output; a second inverter having an input, an output, and first and second supply inputs, where the input of the second inverter is coupled to the output of the first inverter; and a transmission gate having an input, an output, and first and second enable inputs, where the first enable input of the transmission gate is coupled to the output of the first inverter, where the second enable input of the transmission gate is coupled to the output of the second inverter, where the output of the transmission gate is coupled to the output of the driver, where the first supply input of the second inverter is coupled to the output of the transmission gate, and where the second supply input of the second inverter is coupled to the reference terminal.

Example 2. The electronic circuit of example 1, where a first supply input of the first inverter is coupled to the supply terminal, and where a second supply input of the first inverter is coupled to the reference terminal.

Example 3. The electronic circuit of one of examples 1 or 2, where the driver further includes a first transistor having a control terminal, first and second current path terminals, and a bulk terminal, where the control terminal of the first transistor is coupled to the output of the first inverter, where the first current path terminal and the bulk terminal of the first transistor are coupled to the bulk terminal of the high-side transistor, and where the second current path terminal of the first transistor is coupled to the output of the driver.

Example 4. The electronic circuit of one of examples 1 to 3, where the driver further includes a second transistor having a control terminal, first and second current path terminals, and a bulk terminal, where the control terminal of the second transistor is coupled to the supply terminal, where the first current path terminal of the second transistor is coupled to the IO terminal, where the second current path terminal of the second transistor is coupled to the output of the driver, and where the bulk terminal of the second transistor is coupled to the bulk terminal of the first transistor.

Example 5. The electronic circuit of one of examples 1 to 4, where the driver further includes: a third transistor having a control terminal, first and second current path terminals, and a bulk terminal, where the control terminal of the third transistor is coupled to the output of the first inverter, where the first current path terminal of the third transistor is coupled to the output of the driver, and where the bulk terminal of the third transistor is coupled to the bulk terminal of the high-side transistor; and a fourth transistor having a control terminal, first and second current path terminals, and a bulk terminal, where the control terminal of the fourth transistor is coupled to the IO terminal, where the first current path terminal of the fourth transistor is coupled to the second current path terminal of the third transistor, where the second current path terminal of the fourth transistor is coupled to the supply terminal, and where the bulk terminal of the fourth transistor is coupled to the bulk terminal of the third transistor.

Example 6. The electronic circuit of one of examples 1 to 5, where the bias generation circuit includes: a latch having a first node and a second node; a first transistor having a control terminal coupled to the supply terminal, and a current path coupled between the IO terminal and the first node of the latch; a second transistor having a control terminal coupled to the second node of the latch, and a current path coupled between the IO terminal and the output of the bias generation circuit; and a third transistor having a control terminal coupled to the first node of the latch, and a current path coupled between the power supply terminal and the output of the bias generation circuit.

Example 7. The electronic circuit of one of examples 1 to 6, where the output of the bias generation circuit is coupled to a bulk terminal of the first transistor, to a bulk terminal of the second transistor, and to a bulk terminal of the third transistor.

Example 8. The electronic circuit of one of examples 1 to 7, where the bias generation circuit further includes a third inverter having an input and an output, where the input of the third inverter is coupled to the input of the first inverter, and where the output of the third inverter is coupled to the first node of the latch.

Example 9. The electronic circuit of one of examples 1 to 8, where the third inverter includes a first supply input coupled to the supply terminal and a second supply input coupled to the reference terminal.

Example 10. The electronic circuit of one of examples 1 to 9, where the bias generation circuit further includes a current source coupled to the first node of the latch.

Example 11. The electronic circuit of one of examples 1 to 10, where the current source includes a control terminal configured to control whether the current source is enabled or disabled, where the control terminal is coupled to the second node of the latch.

Example 12. The electronic circuit of one of examples 1 to 11, where the current source includes: a fourth transistor having a control terminal, and first and second current path terminals, where the control terminal of the fourth transistor is coupled to the IO terminal, and where the first current path terminal of the fourth transistor is coupled to the supply terminal; a fifth transistor having a control terminal, and first and second current path terminals, where the control terminal of the fifth transistor is coupled to the second node of the latch, and where the first current path terminal of the fifth transistor is coupled to the second current path terminal of the fourth transistor; and a current mirror having an input coupled to the second current path terminal of the fifth transistor, and an output coupled to the first node of the latch.

Example 13. The device of one of examples 1 to 12, where the latch includes a third inverter that includes: a fourth transistor having first and second current path terminals, where the first current path terminal of the fourth transistor is coupled to the supply terminal; a fifth transistor having a control terminal, and first and second current path terminals, where the control terminal of the fifth transistor is coupled to the second node of the latch, where the first current path terminal of the fifth transistor is coupled to the second current path terminal of the fourth transistor, and where the second current path terminal of the fifth transistor is coupled to the first node of the latch; a sixth transistor having a control terminal, and first and second current path terminals, where the control terminal of the sixth transistor is coupled to the second node of the latch, and where the first current path terminal of the sixth transistor is coupled to the first node of the latch; and a seventh transistor having first and second current path terminals, where the first current path terminal of the seventh transistor is coupled to the second current path terminal of the sixth transistor, and where the second current path terminal of the seventh transistor is coupled to the reference terminal.

Example 14. The electronic circuit of one of examples 1 to 13, where the third inverter further includes: an eighth transistor having a control terminal, and first and second current path terminals, where the control terminal of the eight transistor is coupled to the supply terminal, where the first current path terminal of the eighth transistor is coupled to the IO terminal; and a ninth transistor having a control terminal, and first and second current path terminals, where the control terminal of the ninth transistor is coupled to the first node of the latch, where the first current path terminal of the ninth transistor is coupled to the second current path terminal of the eighth transistor, and where the second current path terminal of the ninth transistor is coupled to the second current path terminal of the sixth transistor.

Example 15. The electronic circuit of one of examples 1 to 14, where the bias generation circuit includes a current source that includes a current mirror that includes two transistors having respective control terminals connected together at a first intermediate node, and where the third inverter further includes a tenth transistor having a control terminal coupled to the first intermediate node, and a current path coupled between the control terminal of the fourth transistor and the reference terminal.

Example 16. The electronic circuit of one of examples 1 to 15, further including: an input circuit including: a first level shifter having an input, and an output; a second level shifter having an input, and an output; a third inverter having an input, and an output, where the input of the third inverter is coupled to the output of the second level shifter; a NAND gate having first and second inputs, and an output, where the first input of the NAND gate is coupled to the output of the first level shifter, where the second input of the NAND gate is coupled to the output of the third inverter, and where the output of the NAND gate is coupled to input of the transmission gate; and a NOR gate having first and second inputs, and an output, where the first input of the NOR gate is coupled to the output of the first level shifter, where the second input of the NOR gate is coupled to the output of the second level shifter, and where the output of the NOR gate is coupled to a control terminal of the low-side transistor.

Example 17. The electronic circuit of one of examples 1 to 16, where the high-side transistor, the low-side transistor, the driver, and the bias generation circuit are part of a transmitting path of an IO buffer, the IO buffer further including a receiving path having an amplifier having an input coupled to the IO terminal, where the input of the first inverter is configured to receive a first signal, where the input of the transmission gate is configured to receive a second signal, where, responsive to the first signal being at a first state, the IO buffer is configured to transmit the second signal to the IO terminal, and where, responsive to the first signal being at a second state, the IO buffer is configured to receive a third signal at the IO terminal with the input of the amplifier.

Example 18. An electronic circuit including: an input-output (IO) terminal; a supply terminal; a reference terminal; a high-side transistor having a current path coupled between the supply terminal and the IO terminal; a low-side transistor having a current path coupled between the IO terminal and the reference terminal; a driver having an input and an output, the output of the driver coupled to a control terminal of the high-side transistor; and a bias generation circuit having an output coupled to a bulk terminal of the high-side transistor; where the bias generation circuit includes: a latch having an input and an output; a first transistor having a control terminal coupled to the supply terminal, and a current path coupled between the IO terminal and the first node of the latch; a second transistor having a control terminal coupled to the second node of the latch, and a current path coupled between the IO terminal and the output of the bias generation circuit; and a third transistor having a control terminal coupled to the input of the latch, and a current path coupled between the power supply terminal and the output of the bias generation circuit.

Example 19. The electronic circuit of example 18, where the output of the bias generation circuit is coupled to a bulk terminal of the first transistor, to a bulk terminal of the second transistor, and to a bulk terminal of the third transistor.

Example 20. The electronic circuit of one of examples 18 or 19, where the bias generation circuit further includes a third inverter having an input and an output, where the input of the third inverter is coupled to the input of the first inverter, and where the output of the third inverter is coupled to the first node of the latch.

Example 21. The electronic circuit of one of examples 18 to 20, where the third inverter includes a first supply input coupled to the supply terminal and a second supply input coupled to the reference terminal.

Example 22. The electronic circuit of one of examples 18 to 21, where the bias generation circuit further includes a current source coupled to the first node of the latch.

Example 23. The electronic circuit of one of examples 18 to 22, where the current source includes a control terminal configured to control whether the current source is enabled or disabled, where the control terminal is coupled to the second node of the latch.

Example 24. The electronic circuit of one of examples 18 to 23, where the current source includes: a fourth transistor having a control terminal, and first and second current path terminals, where the control terminal of the fourth transistor is coupled to the IO terminal, and where the first current path terminal of the fourth transistor is coupled to the supply terminal; a fifth transistor having a control terminal, and first and second current path terminals, where the control terminal of the fifth transistor is coupled to the second node of the latch, and where the first current path terminal of the fifth transistor is coupled to the second current path terminal of the fourth transistor; and a current mirror having an input coupled to the second current path terminal of the fifth transistor, and an output coupled to the first node of the latch.

Example 25. The device of one of examples 18 to 24, where the latch includes a third inverter that includes: a fourth transistor having first and second current path terminals, where the first current path terminal of the fourth transistor is coupled to the supply terminal; a fifth transistor having a control terminal, and first and second current path terminals, where the control terminal of the fifth transistor is coupled to the second node of the latch, where the first current path terminal of the fifth transistor is coupled to the second current path terminal of the fourth transistor, and where the second current path terminal of the fifth transistor is coupled to the first node of the latch; a sixth transistor having a control terminal, and first and second current path terminals, where the control terminal of the sixth transistor is coupled to the second node of the latch, and where the first current path terminal of the sixth transistor is coupled to the first node of the latch; and a seventh transistor having first and second current path terminals, where the first current path terminal of the seventh transistor is coupled to the second current path terminal of the sixth transistor, and where the second current path terminal of the seventh transistor is coupled to the reference terminal.

Example 26. The electronic circuit of one of examples 18 to 25, where the third inverter further includes: an eighth transistor having a control terminal, and first and second current path terminals, where the control terminal of the eight transistor is coupled to the supply terminal, where the first current path terminal of the eighth transistor is coupled to the IO terminal; and a ninth transistor having a control terminal, and first and second current path terminals, where the control terminal of the ninth transistor is coupled to the first node of the latch, where the first current path terminal of the ninth transistor is coupled to the second current path terminal of the eighth transistor, and where the second current path terminal of the ninth transistor is coupled to the second current path terminal of the sixth transistor.

Example 27. The electronic circuit of one of examples 18 to 26, where the bias generation circuit includes a current source that includes a current mirror that includes two transistor having respective control terminals connected together at a first intermediate node, and where the third inverter further includes a tenth transistor having a control terminal coupled to the first intermediate node, and a current path coupled between the control terminal of the fourth transistor and the reference terminal.

Example 28. A system including: an input-output (IO) terminal; a supply terminal; a reference terminal; a high-side transistor having a current path coupled between the supply terminal and the IO terminal; a low-side transistor having a current path coupled between the IO terminal and the reference terminal; a driver having an input and an output, the input coupled to receive a data signal and an enable signal, the output of the driver coupled to the high-side transistor; and a bias generation circuit having an output coupled to the high-side transistor; where the bias generation circuit is configured to: determine an IO signal having a first value at the IO terminal; generate a bias signal having a second value based on the first value of the IO signal at the IO terminal; and provide the bias signal to the driver; and where the driver is configured to: based on a first state of the enable signal, drive the input signal to the IO terminal via the high-side transistor; and based on a second state of the enable signal, gate the input signal from being provided from the driver to the IO terminal and gate the IO signal from being provided from the IO terminal to the supply terminal based on providing a control signal to the high-side transistor, the control signal having a third value based on the second value of the bias signal.

Example 29. The system of example 28, where based on the first value of the IO signal exceeding a supply voltage at the supply terminal, the bias generation circuit is configured to generate the bias signal having the second value equal to the first value of the IO signal.

Example 30. The system of one of examples 28 or 29, where based on the first value of the IO signal falling below the supply voltage at the supply terminal, the bias generation circuit is configured to generate the bias signal having the second value equal to the supply voltage.

Example 31. The system of one of examples 28 to 30, where the second value of the bias signal is based on a function of the maximum of the supply voltage and the first value of the IO signal.

Example 32. The system of one of examples 28 to 31, where the first value of the IO signal, the second value of the bias signal, and the third value of the control signal include the same value.

Example 33. The system of one of examples 28 to 32, where the driver includes: a first inverter having an output; a second inverter having an input, an output, and first and second supply inputs, where the input of the second inverter is coupled to the output of the first inverter; and a transmission gate having an input, an output, and first and second enable inputs, where the first enable input of the transmission gate is coupled to the output of the first inverter, where the second enable input of the transmission gate is coupled to the output of the second inverter, where the output of the transmission gate is coupled to the output of the driver, where the first supply input of the second inverter is coupled to the output of the transmission gate, and where the second supply input of the second inverter is coupled to the reference terminal.

Example 34. The system of one of examples 28 to 33, where to drive the input signal to the IO terminal via the high-side transistor, the driver is configured to enable the transmission gate of the driver.

Example 35. The system of one of examples 28 to 34, where to gate the input signal from being provided to the IO terminal, the driver is configured to disable the transmission gate of the driver.

Example 36. The system of one of examples 28 to 35, where the bias generation circuit includes: a latch having a first node and a second node; a first transistor having a control terminal coupled to the supply terminal, and a current path coupled between the IO terminal and the first node of the latch; a second transistor having a control terminal coupled to the second node of the latch, and a current path coupled between the IO terminal and the output of the bias generation circuit; and a third transistor having a control terminal coupled to the first node of the latch, and a current path coupled between the power supply terminal and the output of the bias generation circuit.

Example 37. The system of one of examples 28 to 36, where, based on the first value of the IO signal exceeding a supply voltage of the supply terminal: the first transistor is configured to output a state signal including a state value corresponding to the supply voltage; and the second transistor is configured to output the bias signal including the second value corresponding to the first value of the IO signal.

Example 38. The system of one of examples 28 to 37, where the bias generation circuit further includes a current mirror coupled to the first node of the latch and to the first transistor and configured to, based on the first value of the IO signal falling below the supply voltage at the supply terminal, pull the state signal to a reference value of the reference terminal.

Example 39. The system of one of examples 28 to 38, where, based on the state signal corresponding to the reference value of the reference terminal, the third transistor is configured to output the bias signal corresponding to the supply voltage of the supply terminal.

Example 40. The system of one of examples 28 to 39, where the bias generation circuit further includes: a third inverter having an input coupled to receive the enable signal and an output; and a fourth transistor coupled to the output of the third inverter and to the first node of the latch; where the third inverter is configured to invert the enable signal and provide an inverted enable signal to the first transistor; and where the fourth transistor is configured to, based on the enable signal indicating the first state, pull the state signal to the reference value of the reference terminal.

While some examples provided herein are described in the context of an impedance and wide-band matching system, circuit, sub-circuit, component, device, element, architecture, or environment, the systems, circuits, and methods described herein are not limited to such embodiments and may apply to a variety of other processes, systems, applications, devices, and the like.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or elements are presented in a given order, alternative implementations may perform routines having steps, or employ systems having elements or components, in a different order, and some processes or elements may be deleted, moved, added, subdivided, combined, and/or modified to provide alternative or subcombinations. Each of these processes or elements may be implemented in a variety of different ways. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

What is claimed is:

1. An electronic circuit comprising:
an input-output (IO) terminal;
a supply terminal;
a reference terminal;
a high-side transistor having a current path coupled between the supply terminal and the IO terminal;
a low-side transistor having a current path coupled between the IO terminal and the reference terminal;
a driver having an input and an output, the output of the driver coupled to a control terminal of the high-side transistor; and
a bias generation circuit having an output coupled to a bulk terminal of the high-side transistor;
wherein the driver comprises:
    a first inverter having an output;
    a second inverter having an input, an output, and first and second supply inputs, wherein the input of the second inverter is coupled to the output of the first inverter; and a transmission gate having an input, an output, and first and second enable inputs, wherein the first enable input of the transmission gate is coupled to the output of the first inverter, wherein the second enable input of the transmission gate is coupled to the output of the second inverter, wherein the output of the transmission gate is coupled to the output of the driver, wherein the first supply input of the second inverter is coupled to the output of the transmission gate, and wherein the second supply input of the second inverter is coupled to the reference terminal.

2. The electronic circuit of claim 1, wherein a first supply input of the first inverter is coupled to the supply terminal, and wherein a second supply input of the first inverter is coupled to the reference terminal.

3. The electronic circuit of claim 1, wherein the driver further comprises a first transistor having a control terminal, first and second current path terminals, and a bulk terminal, wherein the control terminal of the first transistor is coupled to the output of the first inverter, wherein the first current path terminal and the bulk terminal of the first transistor are coupled to the bulk terminal of the high-side transistor, and wherein the second current path terminal of the first transistor is coupled to the output of the driver.

4. The electronic circuit of claim 3, wherein the driver further comprises a second transistor having a control terminal, first and second current path terminals, and a bulk terminal, wherein the control terminal of the second transistor is coupled to the supply terminal, wherein the first current path terminal of the second transistor is coupled to the IO terminal, wherein the second current path terminal of the second transistor is coupled to the output of the driver, and wherein the bulk terminal of the second transistor is coupled to the bulk terminal of the first transistor.

5. The electronic circuit of claim 4, wherein the driver further comprises:
    a third transistor having a control terminal, first and second current path terminals, and a bulk terminal, wherein the control terminal of the third transistor is coupled to the output of the first inverter, wherein the first current path terminal of the third transistor is coupled to the output of the driver, and wherein the bulk terminal of the third transistor is coupled to the bulk terminal of the high-side transistor; and
    a fourth transistor having a control terminal, first and second current path terminals, and a bulk terminal, wherein the control terminal of the fourth transistor is coupled to the IO terminal, wherein the first current path terminal of the fourth transistor is coupled to the second current path terminal of the third transistor, wherein the second current path terminal of the fourth transistor is coupled to the supply terminal, and wherein the bulk terminal of the fourth transistor is coupled to the bulk terminal of the third transistor.

6. The electronic circuit of claim 1, wherein the bias generation circuit comprises:
    a latch having a first node and a second node;
    a first transistor having a control terminal coupled to the supply terminal, and a current path coupled between the IO terminal and the first node of the latch;
    a second transistor having a control terminal coupled to the second node of the latch, and a current path coupled between the IO terminal and the output of the bias generation circuit; and a third transistor having a control terminal coupled to the first node of the latch, and a current path coupled between the supply terminal and the output of the bias generation circuit.

7. The electronic circuit of claim 6, wherein the output of the bias generation circuit is coupled to a bulk terminal of the first transistor, to a bulk terminal of the second transistor, and to a bulk terminal of the third transistor.

8. The electronic circuit of claim 6, wherein the bias generation circuit further comprises a third inverter having an input and an output, wherein the input of the third inverter is coupled to the input of the first inverter, and wherein the output of the third inverter is coupled to the first node of the latch.

9. The electronic circuit of claim 8, wherein the third inverter comprises a first supply input coupled to the supply terminal and a second supply input coupled to the reference terminal.

10. The electronic circuit of claim 6, wherein the bias generation circuit further comprises a current source coupled to the first node of the latch.

11. The electronic circuit of claim 10, wherein the current source comprises a control terminal configured to control whether the current source is enabled or disabled, wherein the control terminal is coupled to the second node of the latch.

12. The electronic circuit of claim 11, wherein the current source comprises:

a fourth transistor having a control terminal, and first and second current path terminals, wherein the control terminal of the fourth transistor is coupled to the IO terminal, and wherein the first current path terminal of the fourth transistor is coupled to the supply terminal;

a fifth transistor having a control terminal, and first and second current path terminals, wherein the control terminal of the fifth transistor is coupled to the second node of the latch, and wherein the first current path terminal of the fifth transistor is coupled to the second current path terminal of the fourth transistor; and a current mirror having an input coupled to the second current path terminal of the fifth transistor, and an output coupled to the first node of the latch.

13. The electronic circuit of claim 6, wherein the latch comprises a third inverter that comprises:

a fourth transistor having first and second current path terminals, wherein the first current path terminal of the fourth transistor is coupled to the supply terminal;

a fifth transistor having a control terminal, and first and second current path terminals, wherein the control terminal of the fifth transistor is coupled to the second node of the latch, wherein the first current path terminal of the fifth transistor is coupled to the second current path terminal of the fourth transistor, and wherein the second current path terminal of the fifth transistor is coupled to the first node of the latch;

a sixth transistor having a control terminal, and first and second current path terminals, wherein the control terminal of the sixth transistor is coupled to the second node of the latch, and wherein the first current path terminal of the sixth transistor is coupled to the first node of the latch; and a seventh transistor having first and second current path terminals, wherein the first current path terminal of the seventh transistor is coupled to the second current path terminal of the sixth transistor, and wherein the second current path terminal of the seventh transistor is coupled to the reference terminal.

14. The electronic circuit of claim 13, wherein the third inverter further comprises:

an eighth transistor having a control terminal, and first and second current path terminals, wherein the control terminal of the eight transistor is coupled to the supply terminal, wherein the first current path terminal of the eighth transistor is coupled to the IO terminal; and a ninth transistor having a control terminal, and first and second current path terminals, wherein the control terminal of the ninth transistor is coupled to the first node of the latch, wherein the first current path terminal of the ninth transistor is coupled to the second current path terminal of the eighth transistor, and wherein the second current path terminal of the ninth transistor is coupled to the second current path terminal of the sixth transistor.

15. The electronic circuit of claim 13, wherein the bias generation circuit comprises a current source that comprises a current mirror that comprises two transistors having respective control terminals connected together at a first intermediate node, and wherein the third inverter further comprises a tenth transistor having a control terminal coupled to the first intermediate node, and a current path coupled between the control terminal of the fourth transistor and the reference terminal.

16. The electronic circuit of claim 1, further comprising:

an input circuit comprising:

a first level shifter having an input, and an output;

a second level shifter having an input, and an output;

a third inverter having an input, and an output, wherein the input of the third inverter is coupled to the output of the second level shifter;

a NAND gate having first and second inputs, and an output, wherein the first input of the NAND gate is coupled to the output of the first level shifter, wherein the second input of the NAND gate is coupled to the output of the third inverter, and wherein the output of the NAND gate is coupled to input of the transmission gate; and a NOR gate having first and second inputs, and an output, wherein the first input of the NOR gate is coupled to the output of the first level shifter, wherein the second input of the NOR gate is coupled to the output of the second level shifter, and wherein the output of the NOR gate is coupled to a control terminal of the low-side transistor.

17. The electronic circuit of claim 1, wherein the high-side transistor, the low-side transistor, the driver, and the bias generation circuit are part of a transmitting path of an IO buffer, the IO buffer further comprising a receiving path having an amplifier having an input coupled to the IO terminal, wherein the input of the first inverter is configured to receive a first signal, wherein the input of the transmission gate is configured to receive a second signal, wherein, responsive to the first signal being at a first state, the IO buffer is configured to transmit the second signal to the IO terminal, and wherein, responsive to the first signal being at a second state, the IO buffer is configured to receive a third signal at the IO terminal with the input of the amplifier.

18. An electronic circuit comprising:

an input-output (IO) terminal;

a supply terminal;

a reference terminal;

a high-side transistor having a current path coupled between the supply terminal and the IO terminal;

a low-side transistor having a current path coupled between the IO terminal and the reference terminal;

a driver having an input and an output, the output of the driver coupled to a control terminal of the high-side transistor; and a bias generation circuit having an output coupled to a bulk terminal of the high-side transistor;

wherein the bias generation circuit comprises:

a latch having a first node and a second node;

a first transistor having a control terminal coupled to the supply terminal, and a current path coupled between the IO terminal and the first node of the latch;

a second transistor having a control terminal coupled to the second node of the latch, and a current path coupled between the IO terminal and the output of the bias generation circuit; and a third transistor having a control terminal coupled to the input of the latch, and a current path coupled between the supply terminal and the output of the bias generation circuit.

19. The electronic circuit of claim 18, wherein the output of the bias generation circuit is coupled to a bulk terminal of the first transistor, to a bulk terminal of the second transistor, and to a bulk terminal of the third transistor.

20. A system comprising:

an input-output (IO) terminal;

a supply terminal;

a reference terminal;

a high-side transistor having a current path coupled between the supply terminal and the IO terminal;

a low-side transistor having a current path coupled between the IO terminal and the reference terminal;

a driver having an input and an output, the input coupled to receive an input signal and an enable signal, the output of the driver coupled to the high-side transistor; and a bias generation circuit having an output coupled to the high-side transistor;

wherein the bias generation circuit is configured to:

determine an IO signal having a first value at the IO terminal;

generate a bias signal having a second value based on the first value of the IO signal at the IO terminal; and provide the bias signal to the driver; and wherein the driver is configured to:

based on a first state of the enable signal, provide the input signal to the IO terminal via the high-side transistor; and based on a second state of the enable signal, gate the input signal from being provided from the driver to the IO terminal and gate the IO signal from being provided from the IO terminal to the supply terminal based on providing a control signal to the high-side transistor, the control signal having a third value based on the second value of the bias signal.

\* \* \* \* \*